(12) United States Patent
Goudis

(10) Patent No.: US 10,744,546 B2
(45) Date of Patent: Aug. 18, 2020

(54) WIRE CLEANING APPARATUS AND METHOD

(71) Applicant: Automated Industrial Machinery, Inc., Addison, IL (US)

(72) Inventor: Konstantine Goudis, St. Charles, IL (US)

(73) Assignee: Automated Industrial Machinery, Inc., Addison, IL (US)

( * ) Notice: Subject to any disclaimer, the term of this patent is extended or adjusted under 35 U.S.C. 154(b) by 468 days.

(21) Appl. No.: 15/477,772

(22) Filed: Apr. 3, 2017

(65) Prior Publication Data

US 2017/0282232 A1 Oct. 5, 2017

Related U.S. Application Data

(60) Provisional application No. 62/317,251, filed on Apr. 1, 2016.

(51) Int. Cl.
*A47L 15/00* (2006.01)
*B21C 43/04* (2006.01)
(Continued)

(52) U.S. Cl.
CPC .............. *B21C 43/04* (2013.01); *A46B 9/026* (2013.01); *A46B 9/028* (2013.01); *A46B 13/003* (2013.01);
(Continued)

(58) Field of Classification Search
USPC .......................... 15/88, 88.1, 88.2, 88.3, 88.4
See application file for complete search history.

(56) References Cited

U.S. PATENT DOCUMENTS 3,530,526 A * 9/1970 Schmidt ..................... B08B 1/02
15/302
4,391,016 A * 7/1983 Kawamura ......... B21B 45/0284
15/302

(Continued)

FOREIGN PATENT DOCUMENTS

| ES | 2130910 | 7/1999 |
|---|---|---|
| GB | 2527119 | 12/2015 |
| WO | 2015092821 | 6/2015 |

OTHER PUBLICATIONS

Kullen-Koti GmbH, Direct Industry, "Spiral brush / cylindrical spiral / polishing / for cleaning / deburring," http://www.directindustry.com/prod/kullen/product-15073-1281329.html, pp. 10 (2017).

(Continued)

*Primary Examiner* — Joseph J Hail
*Assistant Examiner* — Shantese L McDonald
(74) *Attorney, Agent, or Firm* — Fitch, Even, Tabin & Flannery LLP

(57) ABSTRACT

A wire cleaning apparatus and method is provided, in which a wire cleaning apparatus includes a passive brush mechanism comprising a helical brush, the helical structure having a helical axis substantially coincident with path of a wire passing through the wire cleaning apparatus. The helical brush includes a plurality of first bristles generally oriented inwardly from the helical structure toward the wire, and the helical brush may be compressed or extended to adjust the inner diameter of the helical brush. The wire cleaning apparatus further comprises an active brush mechanism disposed around the wire and configured to rotate around the wire. The active brush mechanism comprises at least one cylindrical brush having a plurality of second bristles disposed on a cylindrical surface such that one or more of the plurality of second bristles impinge upon the wire. The at least one cylindrical brush having a cylindrical axis about which the at least one cylindrical brush is configured to rotate relative to the active brush mechanism.

20 Claims, 19 Drawing Sheets

(51) Int. Cl.
  *B08B 1/00* (2006.01)
  *B08B 1/02* (2006.01)
  *B08B 1/04* (2006.01)
  *A46B 9/02* (2006.01)
  *A46B 13/04* (2006.01)
  *A46B 15/00* (2006.01)
  *A46B 13/02* (2006.01)
  *A46B 13/00* (2006.01)
  *B08B 3/02* (2006.01)

(52) U.S. Cl.
  CPC ............ *A46B 13/006* (2013.01); *A46B 13/02* (2013.01); *A46B 13/04* (2013.01); *A46B 15/0004* (2013.01); *B08B 1/002* (2013.01); *B08B 1/02* (2013.01); *B08B 1/04* (2013.01); *B08B 3/022* (2013.01)

(56) References Cited

U.S. PATENT DOCUMENTS

| | | | |
|---|---|---|---|
| 4,570,285 A | 2/1986 | Skelton | |
| 4,650,012 A | 3/1987 | Bollinger | |
| 4,982,473 A * | 1/1991 | Farris | B08B 1/02 118/DIG. 21 |
| 5,077,861 A | 1/1992 | Bokat | |
| 5,351,359 A | 10/1994 | Golden | |
| 5,386,882 A | 2/1995 | Friend | |
| 5,647,084 A | 7/1997 | Still | |
| 5,881,419 A | 3/1999 | Millard | |
| 6,990,707 B1 | 1/2006 | Heumann | |
| 7,334,289 B2 * | 2/2008 | Kim | B21C 9/00 15/104.04 |
| 7,641,042 B2 | 1/2010 | Andrews | |
| 7,765,632 B2 | 8/2010 | Lawler | |
| 7,823,235 B2 | 11/2010 | Parish | |
| 8,770,881 B2 | 7/2014 | Dam | |
| 2004/0216254 A1 | 11/2004 | Ueberall | |
| 2006/0174434 A1 * | 8/2006 | Heumann | B08B 1/008 15/88 |
| 2009/0044369 A1 | 2/2009 | Heumann | |
| 2013/0206169 A1 | 8/2013 | Calvet | |
| 2013/0298950 A1 | 11/2013 | Hann | |

OTHER PUBLICATIONS

Tirox Products, Tirox 360° Chain Brush, Cleaner, http://tiroxproducts.com/brush-and-cleaner.html, pp. 2 (2008).
Buxton's Ltd., Beal Spiral Rope Brush—BRB, http://www.buxtons.net/beal-spiral-rope-brush-brb.html, pp. 2 (2017).

* cited by examiner

WIRE CLEANING APPARATUS AND METHOD

RELATED APPLICATIONS

This application claims the benefit of U.S. Provisional Application No. 62/317,251, filed Apr. 1, 2016, which is hereby incorporated by reference in its entirety.

TECHNICAL FIELD

The present invention relates generally to wire processing. More specifically, the invention relates to preparing a wire for processing during industrial manufacturing by removing residues deposited on the wire during manufacturing, storage, or transportation.

BACKGROUND

Many industrial processes use metal wire as a raw material. These processes use different types of wire, composed of different materials, cross-sectional shapes, and sizes. For example, wires may be formed from numerous steel alloys, from brass, bronze, aluminum, copper, and numerous other metals. For purposes of this application, a wire can comprise a solid core, stranded wires, tubes, and other cross-sectional shapes.

Typically, wire is fed directly from coil stock to a manufacturing machine, but wire may also be supplied in straight segments. During manufacturing, storage, and transportation of the wires described above, a variety of contaminants adhere themselves to the outer surfaces of the wires. Wire drawing compound used to lubricate the wire during drawing and forming of the wire may form scaly deposits on the surface of the wire. Other contaminants might include oil applied to the wire to prevent corrosion during transportation or storage. Oil attracts dirt and other debris, which may further contaminate the surface of the wire.

All of the contaminants discussed above cause difficulties when the wire is processed in subsequent manufacturing steps. Wire may be subjected to one or more primary operations, including for example straightening, drilling, cutting, machining, cold-forming, threading, marking, stamping, or bending. Each of these primary operations may be hindered by scale or other debris adhered to the surface of the wire. Scale and debris become trapped in automated machinery and may damage tooling or reduce the efficiency of the machinery. Thus, it is desirable to clean the surface of the wire prior to performing these primary operations.

Wires may also be subjected to secondary operations such as painting, surface-treatment, or assembly. These secondary operations often require parts that are free from all contaminants including scale, debris, and oil. Parts may be difficult to clean after they have undergone primary operations because they may have features and shapes that trap contaminants or that make it difficult to scrub the full surface of the part. Thus, it is desirable to clean the surface of the wire before the wire is subjected to any manufacturing operations, even if primary operations are not affected by contaminants on the wire.

Manufacturing machines typically accommodate a variety of wire sizes. For example, automated wire bending machines are designed for use with a range of wire diameters. In many manufacturing machines no major tool changes are necessary even though wire diameter may change from job to job. It is therefore desirable that any wire processing equipment associated with these manufacturing machines be capable of easy adjustment to accommodate a similar range of wire diameters.

Although methods are known for cleaning various contaminants from the surface of a wire, it is desirable to develop a machine or system designed to remove all contaminants. In particular, it is desirable to develop a machine or system designed to remove contaminants from the surface of a wire as the wire is fed from a coil and into a wire bending machine, such that the wire is cleaned on-demand. Further, it is desirable to develop a machine or system designed to clean wires having a variety of wire diameters or cross-sectional profiles, in keeping with the flexibility designed into many wire bending machines.

SUMMARY

Generally speaking and pursuant to these various embodiments, a wire cleaning apparatus is provided, comprising a passive brush mechanism and an active brush mechanism. The passive brush mechanism surrounds and defines a wire path. The wire path defines a space where, during operation, a wire will be drawn through the wire cleaning apparatus. The passive brush mechanism comprises a helical brush having a plurality of first bristles affixed to a helical structure, the helical structure having a helical axis substantially coincident with the wire path, the plurality of first bristles generally oriented inwardly from the helical structure toward the wire path. The passive brush mechanism further comprises a first member slidably affixed to the passive brush mechanism and coupled to a first end of the helical brush.

The active brush mechanism is disposed around the wire path and configured to rotate around the wire path. The active brush mechanism comprises at least one cylindrical brush having a plurality of second bristles disposed on a cylindrical surface such that one or more of the plurality of second bristles impinge upon the wire path. The at least one cylindrical brush comprises a cylindrical axis about which the at least one cylindrical brush is configured to rotate relative to the active brush mechanism.

In one described example, the wire cleaning apparatus further includes a resilient wiper having an aperture concentric with the wire path, the aperture configured to receive a wire of a predetermined cross-sectional profile.

In another described example, the wire cleaning apparatus further includes a wiper holder configured to receive the resilient wiper, the wiper holder disposed at a fixed location along the wire path.

In another described example, the wire cleaning apparatus further includes at least one adjustably mounted nozzle disposed in the vicinity of the active brush mechanism and in fluid communication with a reservoir configured to receive an aqueous detergent solution.

In another described example, the helical brush of the wire cleaning apparatus further includes a second end of the helical brush that is coupled to a fixed surface of the passive brush mechanism.

In another described example, the second end of the helical brush of the wire cleaning apparatus further is coupled to a second member slidably affixed to the passive brush mechanism.

In another described example, the passive brush mechanism of the wire cleaning apparatus further includes a plurality of slots arranged in the passive brush mechanism substantially parallel to the wire path; and at least one tension adjuster engaged through one of the plurality of slots with the first member, such that the tension adjuster secures the first member in a position relative to the plurality of slots.

In another described example, the active brush mechanism of the wire cleaning apparatus further includes an annular gear and the at least one cylindrical brush further comprising a spur gear disposed to interact with the annular gear on the active brush mechanism such that the spur gear is configured to cause the cylindrical brush to rotate on the cylindrical axis when the active mechanism rotates around the wire path.

In another described example, the active brush mechanism of the wire cleaning apparatus further includes a stationary pulley and a belt disposed on the stationary pulley, and the at least one cylindrical brush further comprising a pulley about which the belt wraps such that the belt is configured to cause the cylindrical brush to rotate on the cylindrical axis when the active mechanism rotates around the wire path.

In another described example, the wire cleaning apparatus further includes a drying stage comprising a funnel disposed around the wire path, the funnel having a large end and a small end and an input configured to deliver high-speed air to the funnel.

In another described example, the wire cleaning apparatus further includes a motion detection sensor configured to change a signal in response to motion of a wire traveling along the wire path; and a control device configured to activate the drying stage in response to the change in the signal from the motion detection sensor.

In another described example, the wire cleaning apparatus further includes a motion detection sensor configured to change a signal in response to motion of a wire traveling along the wire path; and a control device configured to activate the active brush mechanism in response to the change in the signal from the motion detection sensor.

Further pursuant to these various embodiments, a method is disclosed for cleaning an outer surface of a wire by passing the wire through a wire cleaning system, the method comprising: removing debris from the outer surface of the wire with a passive brush mechanism comprising a helical brush having a plurality of first bristles affixed to a helical structure, the helical structure having a helical axis substantially coincident with a long axis of the wire, the plurality of first bristles generally oriented inwardly from the helical structure to contact the outer surface of the wire; scrubbing the outer surface of the wire with an active brush mechanism disposed around the wire path and configured to rotate around the wire path, the active brush mechanism comprising at least one cylindrical brush having a plurality of second bristles disposed on a cylindrical surface such that one or more of the plurality of second bristles contact the outer surface of the wire, the at least one cylindrical brush having a cylindrical axis about which the at least one cylindrical brush rotates relative to the active brush mechanism.

In another described example, the method further comprises cleaning an outer surface of a wire further includes impinging upon the outer surface of the wire with a resilient wiper that substantially encircles the wire.

In another described example, the method further comprises cleaning an outer surface of a wire further includes spraying an aqueous detergent solution on the wire in the vicinity of the active brush mechanism using at least one nozzle disposed in the vicinity of the active brush mechanism.

In another described example, the method disclosed for cleaning an outer surface of a wire further comprises detecting movement of the wire by a movement sensor and controlling the state of a device based on the output of the movement sensor. Based on the output of the movement sensor the active brush mechanism may be activated or deactivated.

In another described example, the method is disclosed for cleaning an outer surface of a wire further comprising drying the outer surface of the wire at a drying station using high-speed air.

In another described example, the method is disclosed for cleaning an outer surface of a wire further includes detecting movement of the wire by a movement sensor. In response to the change in the signal received from the movement sensor, activating the drying station.

BRIEF DESCRIPTION OF THE DRAWINGS

The above needs are at least partially met through provision of a wire cleaning apparatus described in the following detailed description, particularly when studied in conjunction with the drawings, wherein.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted to facilitate a less obstructed view of these various embodiments. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION

Figure 1:
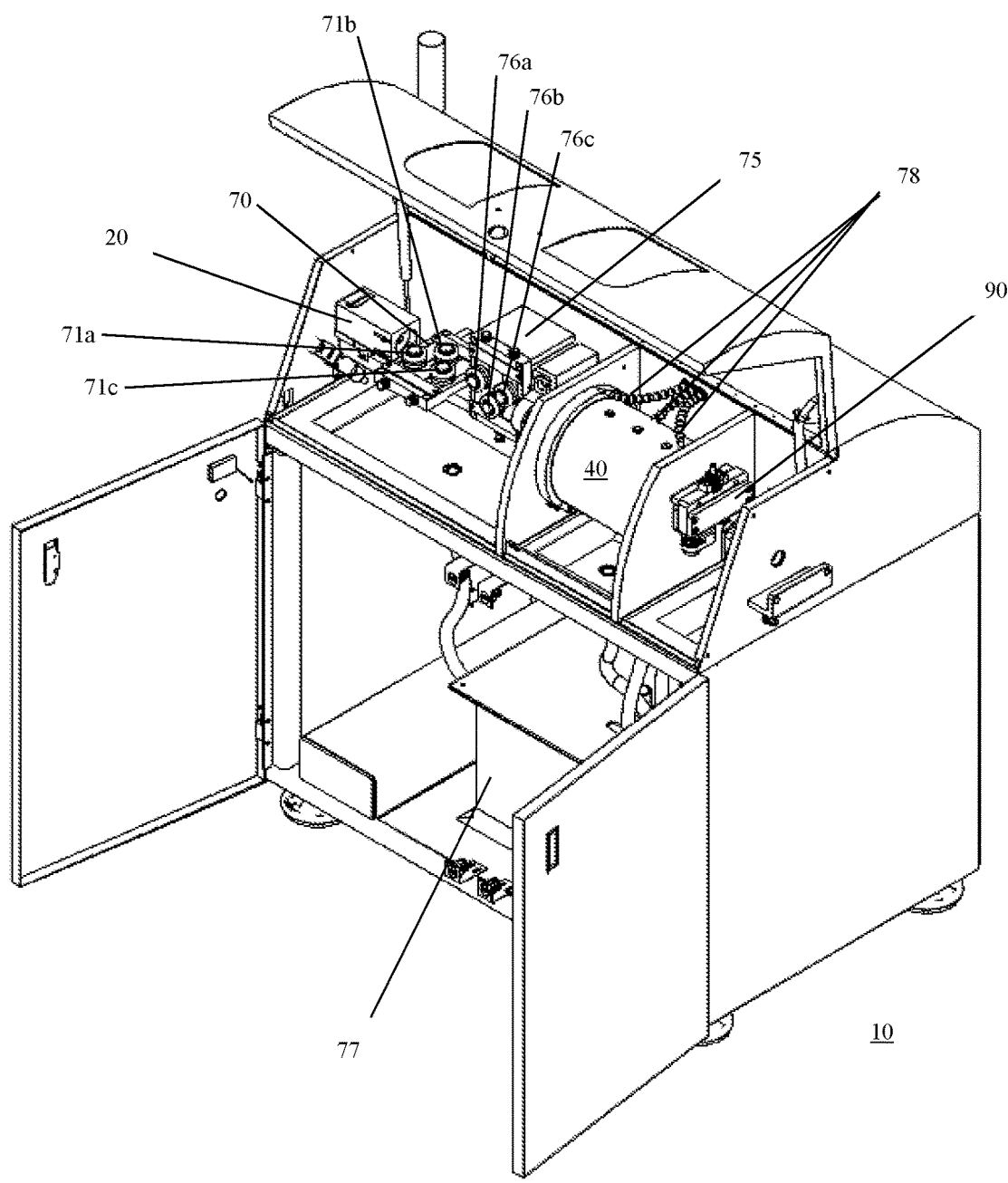
FIG. 1 comprises an isometric view of a wire cleaning apparatus, with enclosures shown in the open position.
Figure 2:
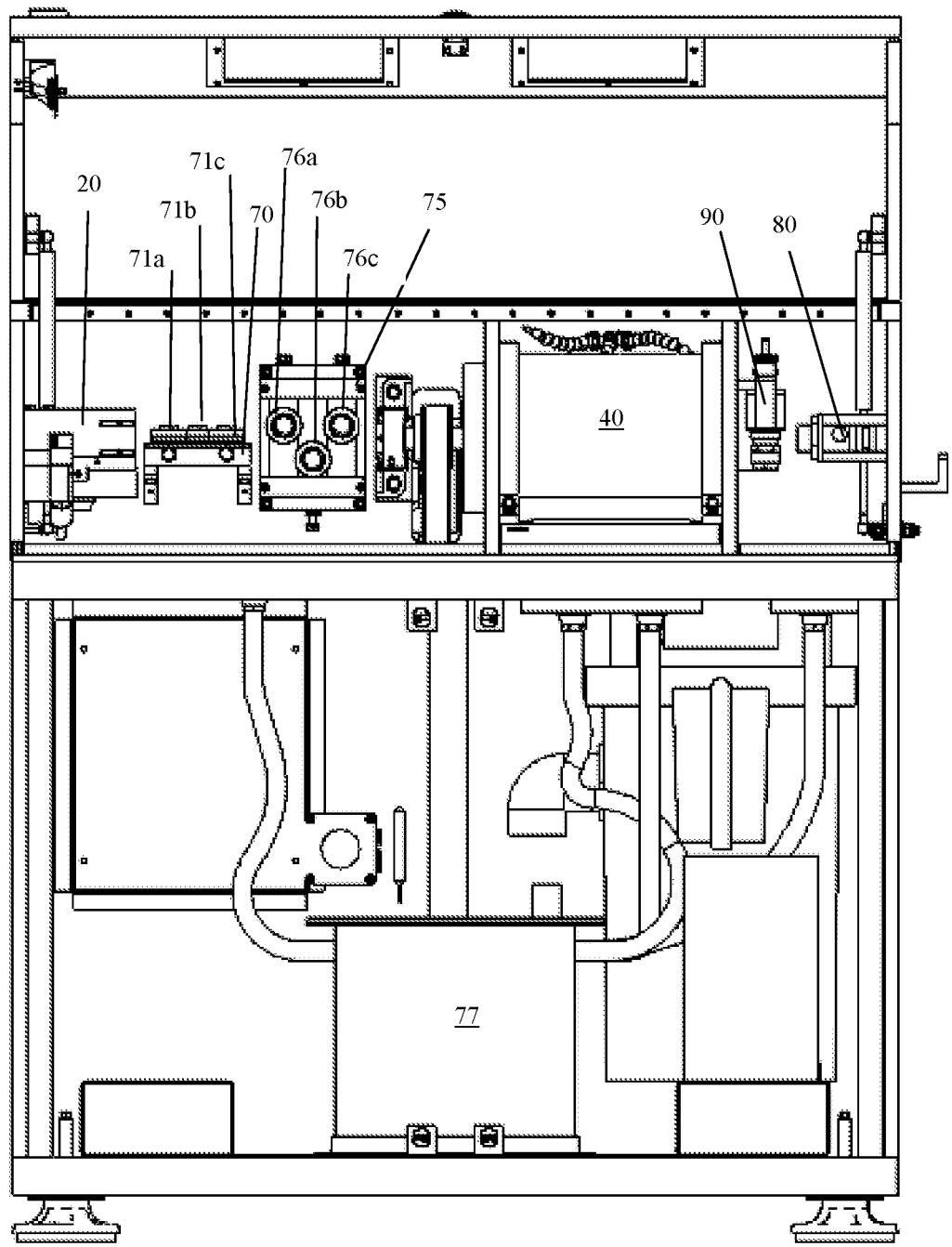
FIG. 2 comprises a front view of a wire cleaning apparatus, with enclosures shown in the open position.
Figure 3:
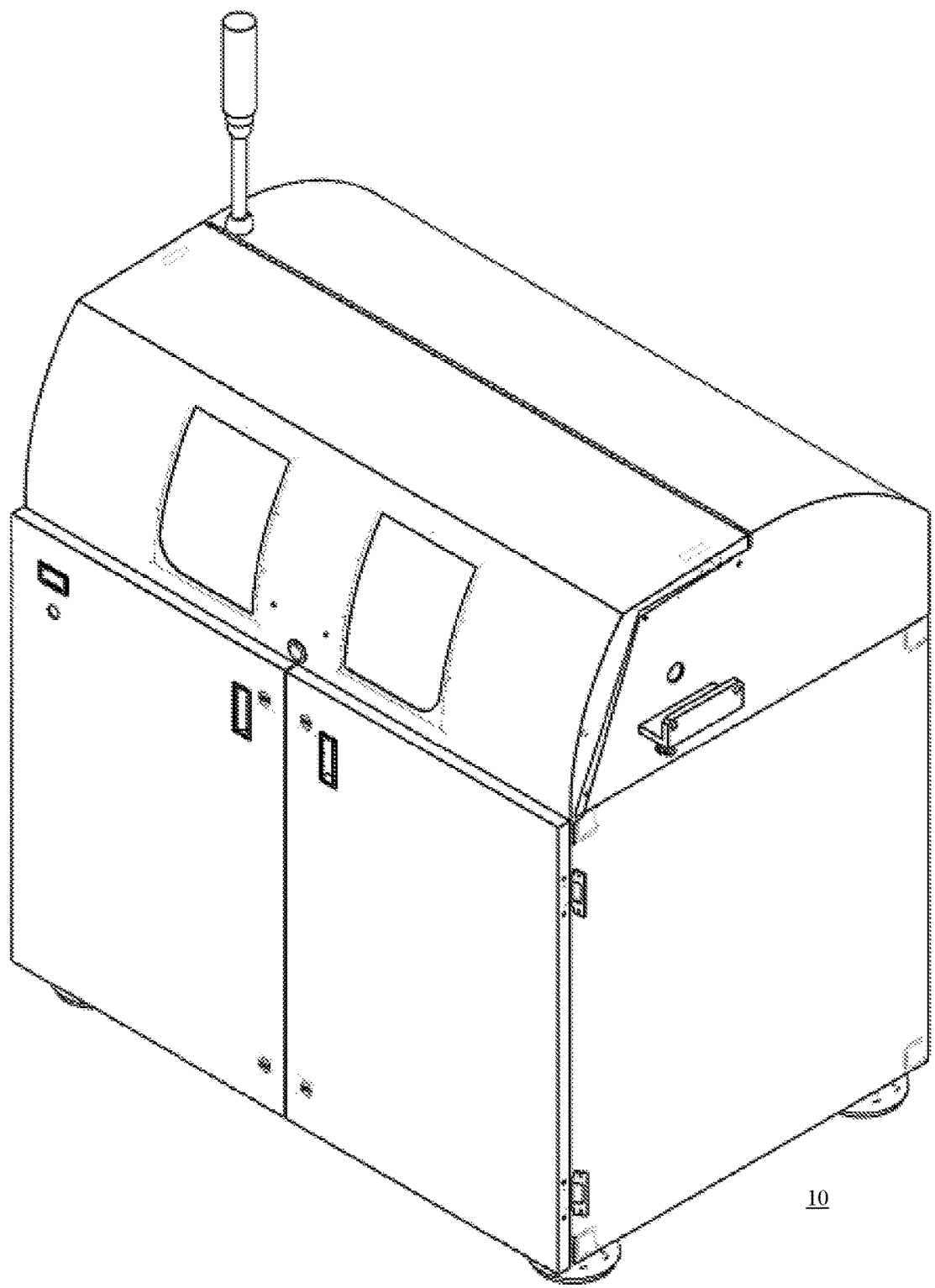
FIG. 3 comprises an isometric view of a wire cleaning apparatus, with enclosures shown in the closed position.

In one embodiment, a wire cleaning apparatus is illustrated in FIGS. 1-3. A wire 5 passes through the wire cleaning apparatus 10 from left to right in the illustration. The wire cleaning apparatus 10 includes a passive helical brush mechanism 20, which removes scale and debris from a wire 5 (not shown in FIG. 1). Horizontal straighter 70, and vertical straightener 75 remove minor bends from the wire 5. An active rotating brush mechanism 40 removes oil and other surface deposits from the wire 5. The active rotating brush mechanism 40 may use a soap or detergent solution stored in reservoir 77, and sprayed on the wire 5 using adjustable nozzles 78.

The horizontal straightener 70 comprises three or more rollers 71a-71c arranged such that two rollers 71a and 71c support one side of the wire and a third roller 71b impinges upon an opposite side of the wire at a point between the contact points provided by the two rollers 71a and 71c. By way of this orientation, the wire is worked horizontally and minor bends in the horizontal orientation are removed from the wire. Similarly, the vertical straightener 75 comprises three or more rollers 76a-76c arranged such that two rollers 76a and 76c support an upper side of the wire and a third roller 76b impinges upon the bottom side of the wire at a point between the contact points provided by the two rollers 76a and 76c. By way of this orientation of the rollers 76a-76c, the wire is worked vertically and minor bends in the vertical orientation are removed from the wire. The features of the illustrated straighteners 70 and 75 may additionally include adjustment mechanisms or allow for replacement of the rollers 71a-71c and 76a-76c, as known in the art, so that the straighteners 70 and 80 may accommodate a variety of wire diameters.

The reservoir 77 may be integrated into wire cleaning apparatus 10 or may exist as a separate unit which can be operably connected to one or more of the wire cleaning apparatus 10 to, for example, limit the amount of hose necessary to install multiple units in a workspace or to reduce the cost of purchasing multiple of the wire cleaning apparatus 10. Similarly, the reservoir 77 may be removable from the wire cleaning apparatus 10 to enable cleaning.

Optionally, the wire cleaning apparatus 10 includes a wire guide mechanism 90, which is adjustable to accommodate varying sized wires. The wire guide mechanism 90 may also include a sensor, such as an encoder, for detecting movement of the wire 5. The sensor is preferably a rotary encoder. The rotary encoder may utilize optical, mechanical or magnetic means to detect the movement of the wire. The wire cleaning apparatus 10 may also include a drying stage 80 designed to remove moisture from the wire by applying high-velocity stream of air to the surface of the wire such that residual moisture is blown off the wire.

Figure 4:
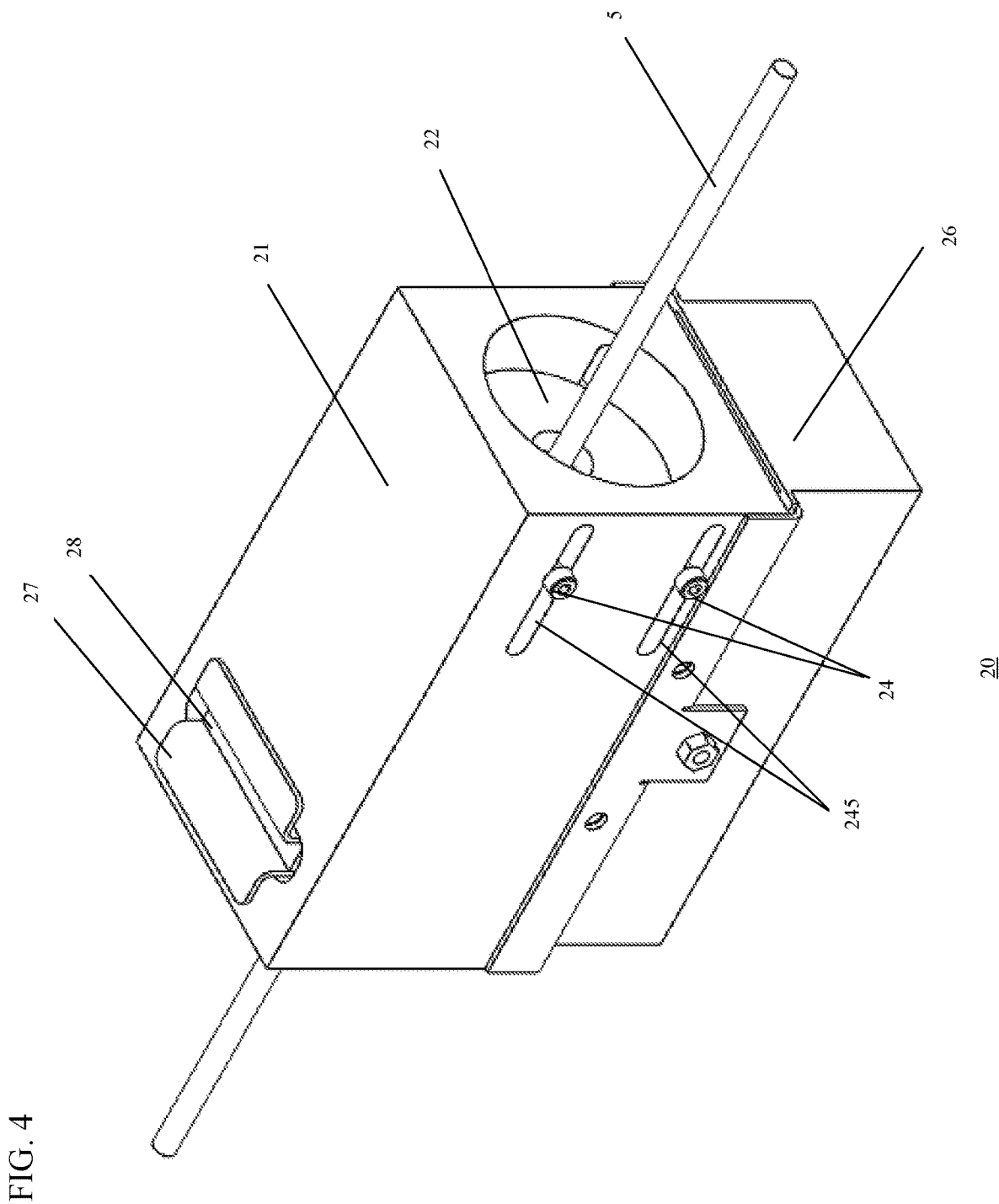
FIG. 4 comprises an isometric view of a helical brush mechanism of a wire cleaning apparatus.
Figure 5:
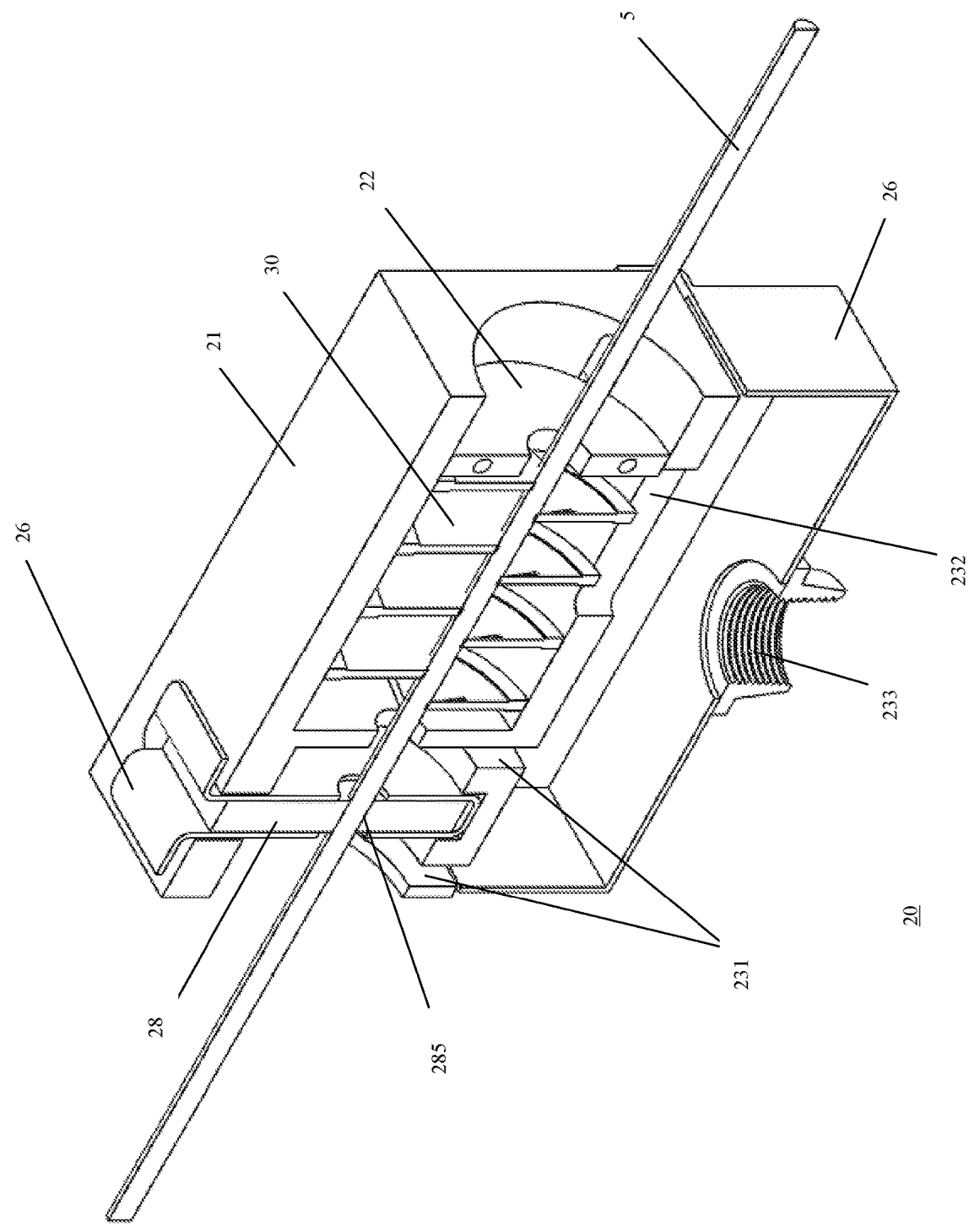
FIG. 5 comprises a cut-away view of a helical brush mechanism of a wire cleaning apparatus.

Exemplary features of the wire cleaning apparatus are illustrated in FIGS. 1-20, in which like numbers indicate like elements. The elements of the drawings are described as follows:

5: Wire
10: Wire cleaning apparatus
20: Helical brush mechanism
21: Helical brush mechanism body
22: Tension adjustment plate
231: Wiper area debris passage
232: Helical brush debris passage
233: Drain
24: Adjustment screws
245: Adjustment slot
26: Debris collection bin
27: Wiper holder
28: Wiper
285: Wiper aperture
30: Helical brush
32: Helical bristle channel
33: Bristles
35: Inner diameter
40: Rotating brush mechanism
41: Pulley
42: Rotating brush drive shaft
45: Cylindrical brush assembly
46: Bristles
47: Quick release pin
475: Quick release body
476: Quick release button
48: Shaft
485: Hole (optionally slotted)
51: Planetary gear housing
515: Pin
525: Rotating brush housing (drive end)
526: Rotating brush housing (support end)
524: Pin
535: Seal cover (drive end)
536: Seal cover (support end)
544: Seal and bearing supporting a brush support shaft
545: Rotating brush plate (drive end)
546: Rotating brush plate (support end)
549: Stabilizing member
55: Annular gear
56: Planetary gear
571: Brush support shaft (drive end)
572: Brush support shaft (support end)
575: Brush shaft receiver (drive end)
576: Brush shaft receiver (support end)
58: Bearing 70: Horizontal wire straightener
71: Horizontal wire straightener roller
75: Vertical wire straightener
76: Vertical wire straightener roller
77: Wash water reservoir
78: Flexible nozzle
80: Wire air wipe
90: Wire guide and movement detection mechanism
901: Wire guide adjustment knob
902: Wire guide adjustment locking knob
903: Wire guide adjustment screw
910: Encoder
915: Encoder idler roller
920: Wire guide body
921: Adjustment cam
922: Cam follower
923: Cam follower
924: Spring
928: Wire guide bottom plate
930: Wire guide front body plate
940: Wire guide rear body plate
951: Wire guide roller
952: Wire guide roller
953: Encoder support member FIGS. 4 and 5 further illustrate the helical brush mechanism 20. The helical brush mechanism is comprised of a body 21 and a debris collection bin 26. The helical brush 30 is fastened at one end to the body 21, and at the other end to the tension adjustment plate 22. By loosening the adjustment screws 24, the adjustment plate 22 can be moved along the adjustment slots 245 such that the helical brush is extended or compressed. As discussed further below, extending or compressing the helical brush 30 serves to adjust the inner diameter of the brush such that different sized wires may be accommodated by the same passive helical brush mechanism 20. Adjustment screws and the adjustment slots are identically arranged on the wall opposite the wall on which they are illustrated in FIG. 4. Alternatively, the helical brush 30 may be adjustable at both ends through the use of a second set of adjustment slots, adjustment screws, and an adjustment plate fastened at the opposite end of the helical brush 30.

The passive helical brush mechanism 20 may include a wiper holder 27 with a wiper 28. The wiper 28 may be fabricated from any resilient material, but is preferably fabricated from a sheet of rubber such that the wiper 28 removes oil and large debris from the surface of the wire 5. As the wire passes through the wiper aperture 285 the removed oil and debris fall into the debris collection bin 26 through the wiper area debris passage 231. The wiper holder may be removed from the body 21 to facilitate replacement of the wiper. Replacing the wiper 28 allows for the use of differently shaped and sized wipers that accommodate a variety of wire diameters and shapes. Similarly, as the wire passes through the helical brush 30, removed oil and debris fall through the helical brush debris passage 232. In various embodiments, the helical brush debris passage may have different lengths. A drain 233 is disposed at the bottom of the debris collection bin 26 such that the removed oil and debris may pass out of the bin. In some embodiments, a liquid spray may be used to flush debris from the passive helical brush mechanism 20 in a continuous or periodic fashion.

FIGS. 6 and 7 further illustrate the behavior of the helical brush 30, as it is extended or compressed. The helical brush 30 is comprised of a helical bristle channel 32 and bristles 33. The helical bristle channel 32 forms a helix, having a series of coils, each of which is spaced from the last by a pitch distance P. The helical bristle channel 32 is a channel fabricated from a resilient material such as steel, aluminum, or high strength plastic. The bristles 33 are arranged with one end embedded and secured in the bristle channel 32, and a second end of each bristle 33 extends to the opening 35 in the middle of the helical brush. The opening 35 extends along the axis of the helical brush 30. The bristles 33 are preferably arranged in a substantially continuous row, although some embodiments may utilize tufts of bristles.

Figure 6A:
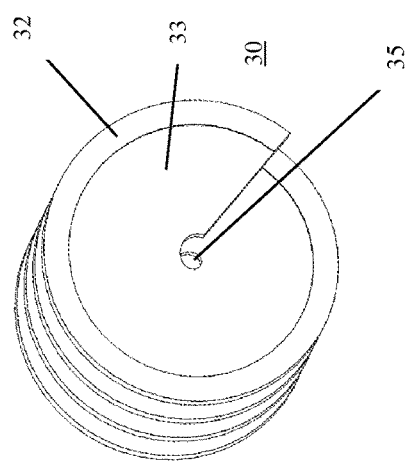
FIG. 6A comprises an isometric view of a helical brush in a compressed state.
Figure 6B:
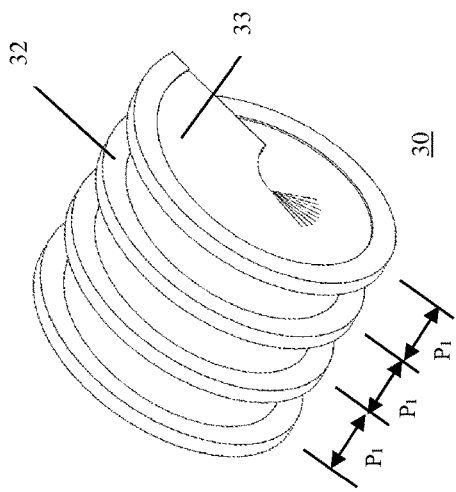
FIG. 6B comprises a perspective view of a helical brush, illustrating an inner diameter of the helical bristles in a compressed state.
Figure 7A:
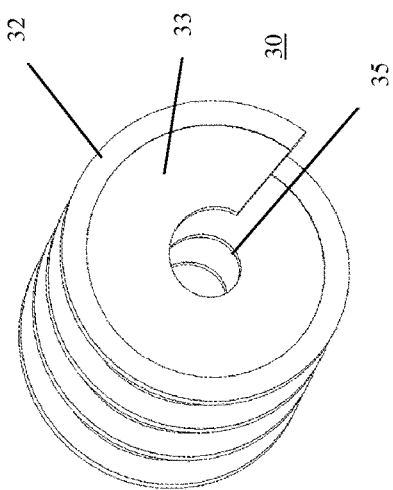
FIG. 7A comprises an isometric view of a helical brush in an expanded state.
Figure 7B:
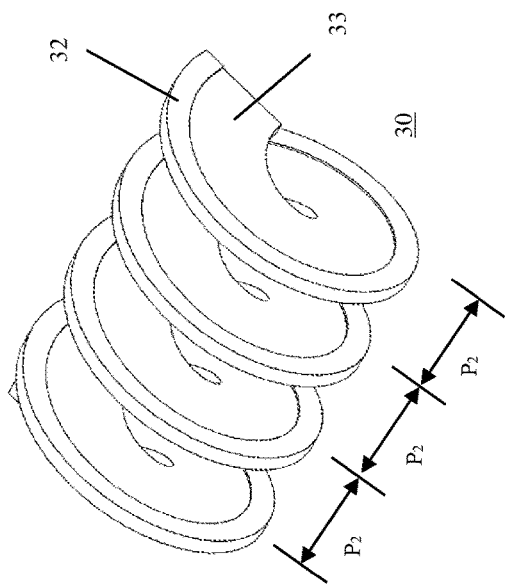
FIG. 7B comprises a perspective view of a helical brush, illustrating an inner diameter of the helical bristles in an expanded state.

FIGS. 6A and 6B illustrate the helical brush 30 in a compressed position, in which the pitch between the coils is the distance P1. FIG. 6B illustrates that an inner diameter 35 of the helical brush 30 is compressed when the bristles 33 are displaced by compressing the helical bristle channel 32 as shown in FIGS. 6A and 6B. FIGS. 7A and 7B illustrate the helical brush 30 in a compressed position, in which the pitch between the coils is the distance P2. FIG. 7A illustrates a helical brush having a pitch, P2, wider than the pitch between coils of the helical brush illustrated in FIG. 6A. FIG. 7B illustrates that an inner diameter 35 of the helical brush 30 is enlarged as the pitch between the coils of the helical bristle channel becomes larger. Conversely, as is apparent from FIGS. 6 and 7, the inner diameter of the helical brush becomes smaller as the pitch between the coils of the helical bristle channel becomes smaller.

Figure 8:
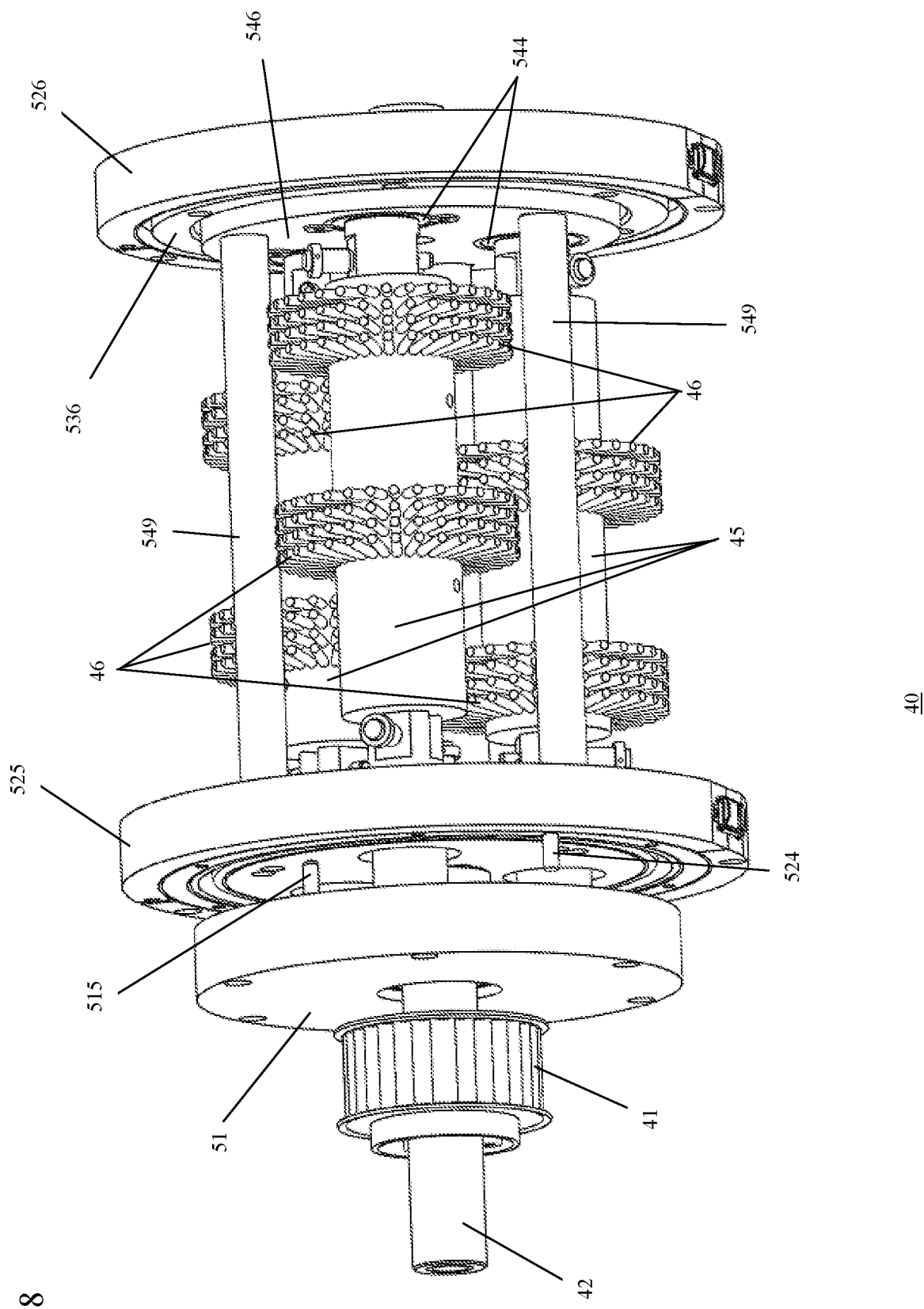
FIG. 8 comprises a perspective view of an orbital scrubbing mechanism of the wire cleaning apparatus.

FIGS. 8-15 illustrate an active rotating brush mechanism 40, in which cylindrical brushes 45 scrub the wire 5 as the wire passes along the center axis of the rotating brush mechanism. In one embodiment, the active rotating brush mechanism 40 comprises three cylindrical brush assemblies 45, each of which has bristles 46. FIG. 8 illustrates the active rotating brush mechanism 40. The planetary gear housing 51 is stationary and connects to a wall (not shown in FIG. 8) within the wire cleaning apparatus 10. Pins 515 secure the planetary gear housing 51 to the wall. The drive end housing 525 and the support end housing 526 are both stationary. Pins 524 secure the drive end housing 525 to a wall (not shown in FIG. 8) within the wire cleaning apparatus 10. The rotating drive end brush plate 545 and rotating supporting end brush plate 546 are connected by three supporting members 549 that rotate with the two rotating plates 545 and 546. The seal covers 535 (not shown in FIG. 8) and 536 prevents fluid from entering space between the brush plates 545 and 546 from their respective housing 525 and 526.

The cylindrical brush assemblies 45 simultaneously orbit the wire 5 and rotate through the action of a planetary gear mechanism. The bristles 46 physically contact the outer surface of the wire 5 to remove oil and debris from the surface of the wire. The bristles 46 may be made of any resilient material suitable to remove dirt and debris from the surface of the wire 5, including metal or high-temperature polymer. In a preferred embodiment, the bristles 46 are nylon.

An input shaft 42 drives the rotating brush mechanism 40. The input shaft 42 connects to the drive plate 545 to affect the orbital and rotary motion of the brush assemblies 45. The input shaft 42 is driven by a pulley 41. A belt (not shown in FIG. 8) drives the pulley 42.

In one embodiment, at least one flexible nozzle 78 is disposed in the vicinity of the active brush mechanism 40 such that the nozzle 78 may be positioned to spray an aqueous detergent solution on the wire 5 and/or the active brush mechanism 40. The flexible nozzle 78 is in fluid communication with a reservoir 77 configured to receive an aqueous detergent solution. The detergent is delivered into the housing of the brush mechanism through one or more apertures (see FIGS. 1 and 2—the apertures are not shown in FIG. 8) and aids in the removal of oil and debris from the wire 5.

Figure 9:
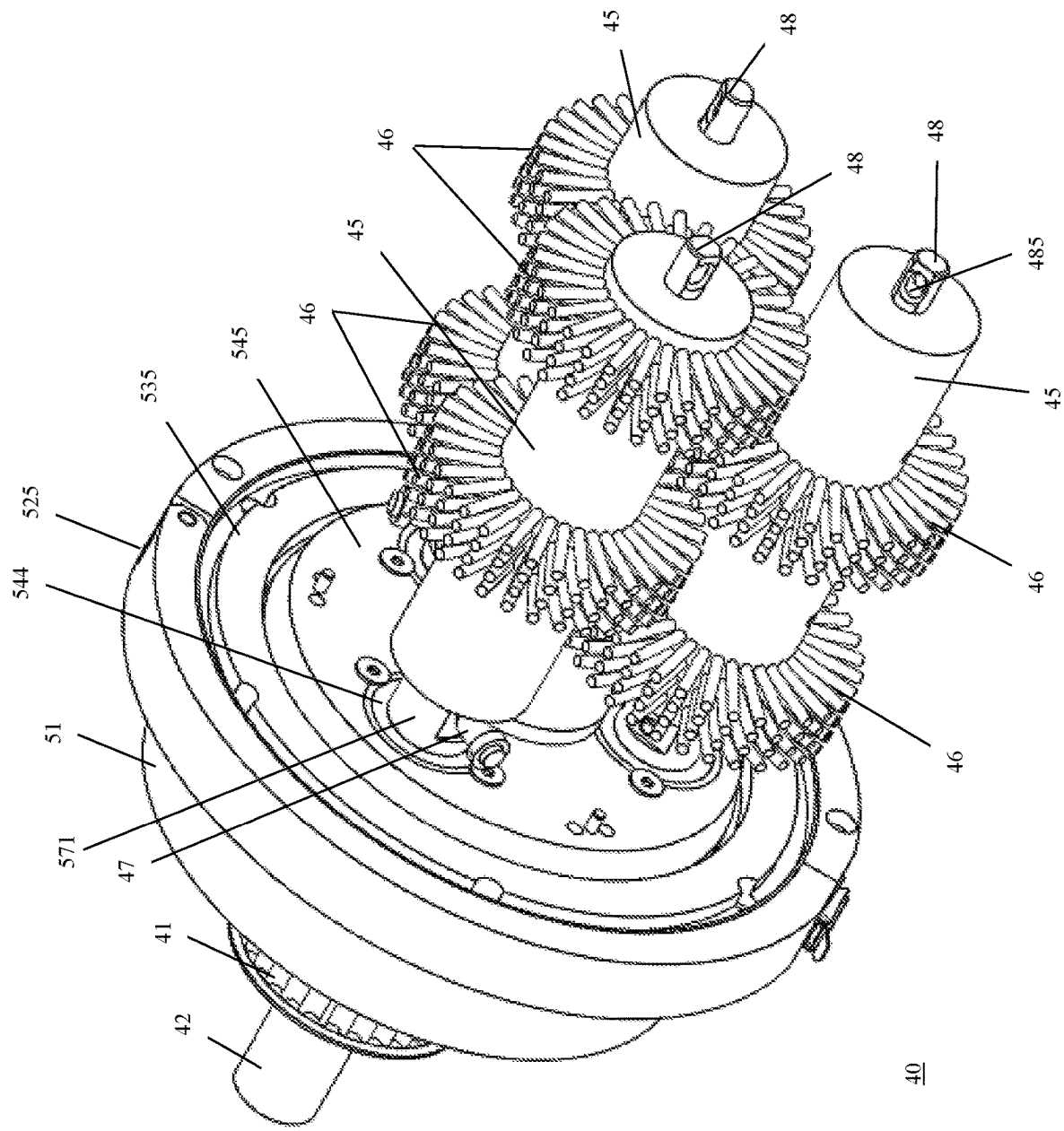
FIG. 9 comprises a perspective view of an orbital scrubbing mechanism of a wire cleaning apparatus, with supporting end plates removed.
Figure 10:
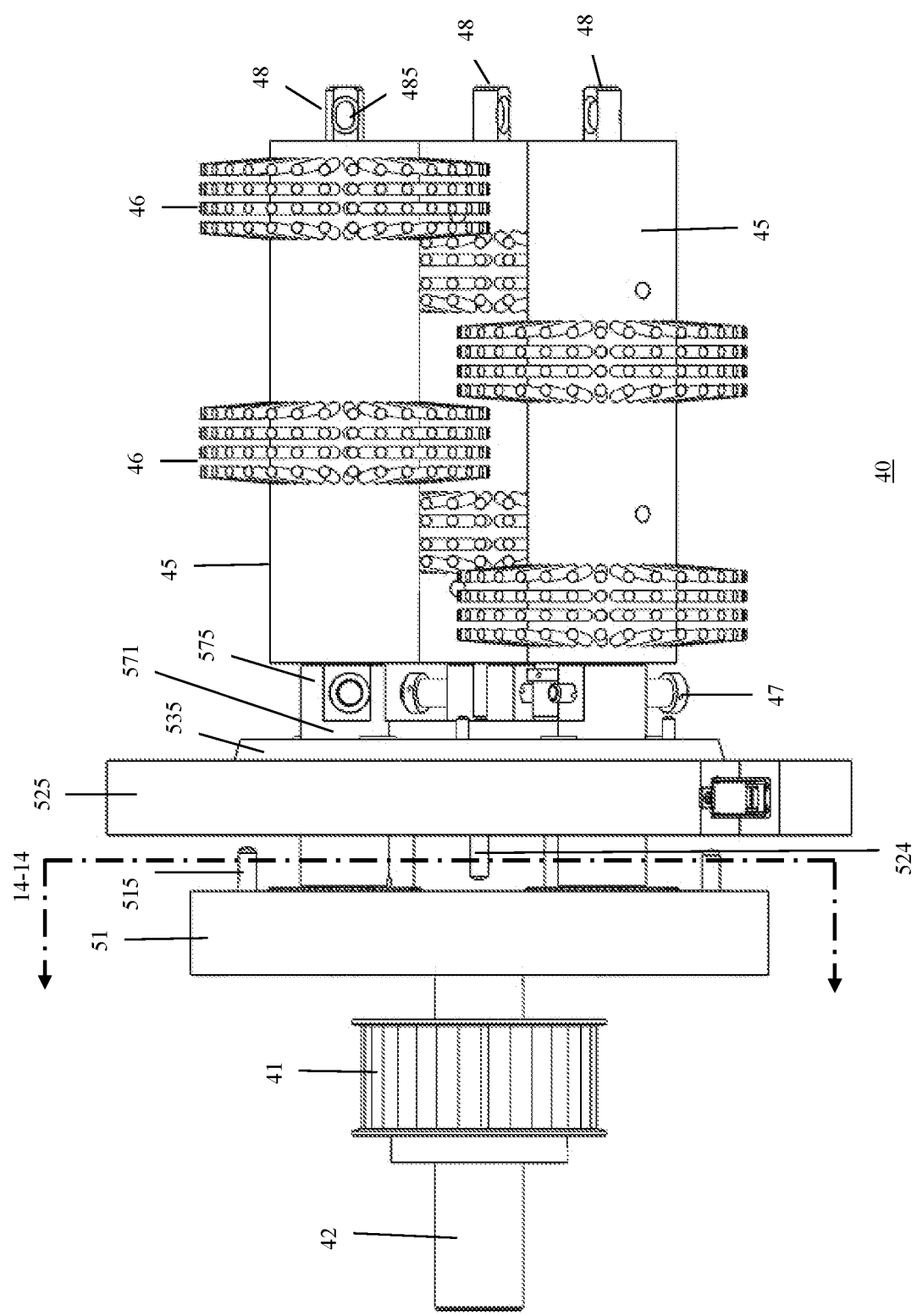
FIG. 10 comprises a front view of an orbital scrubbing mechanism of a wire cleaning apparatus, having supporting end plates removed.

FIGS. 9 and 10 illustrates the active rotating brush mechanism 40, with the components of the support end removed. Each of the brush assemblies 45 comprise a keyed shaft 48 having one or more flat such that a brush shaft receiver 575 comprising a yoke in the brush support shaft 571 interlocks the keyed shaft 48. The keyed shaft 48 has a hole 485 through which a quick release pin 47 passes. In a preferred embodiment, the hole 485 is slotted. In FIGS. 9 and 10 a quick release pin 47 is illustrated at the drive end of the cylindrical brush assembly 45, but is not shown on the support end.

The drive end rotating brush plate 545 is illustrated in FIG. 9, with three holes into which a bearing/seal 544 is pressed. The bearing/seal 544 encircles the brush support shaft 571. The drive end seal cover 535 encircles the rotating brush drive plate 545, as discussed above.

Figure 11:
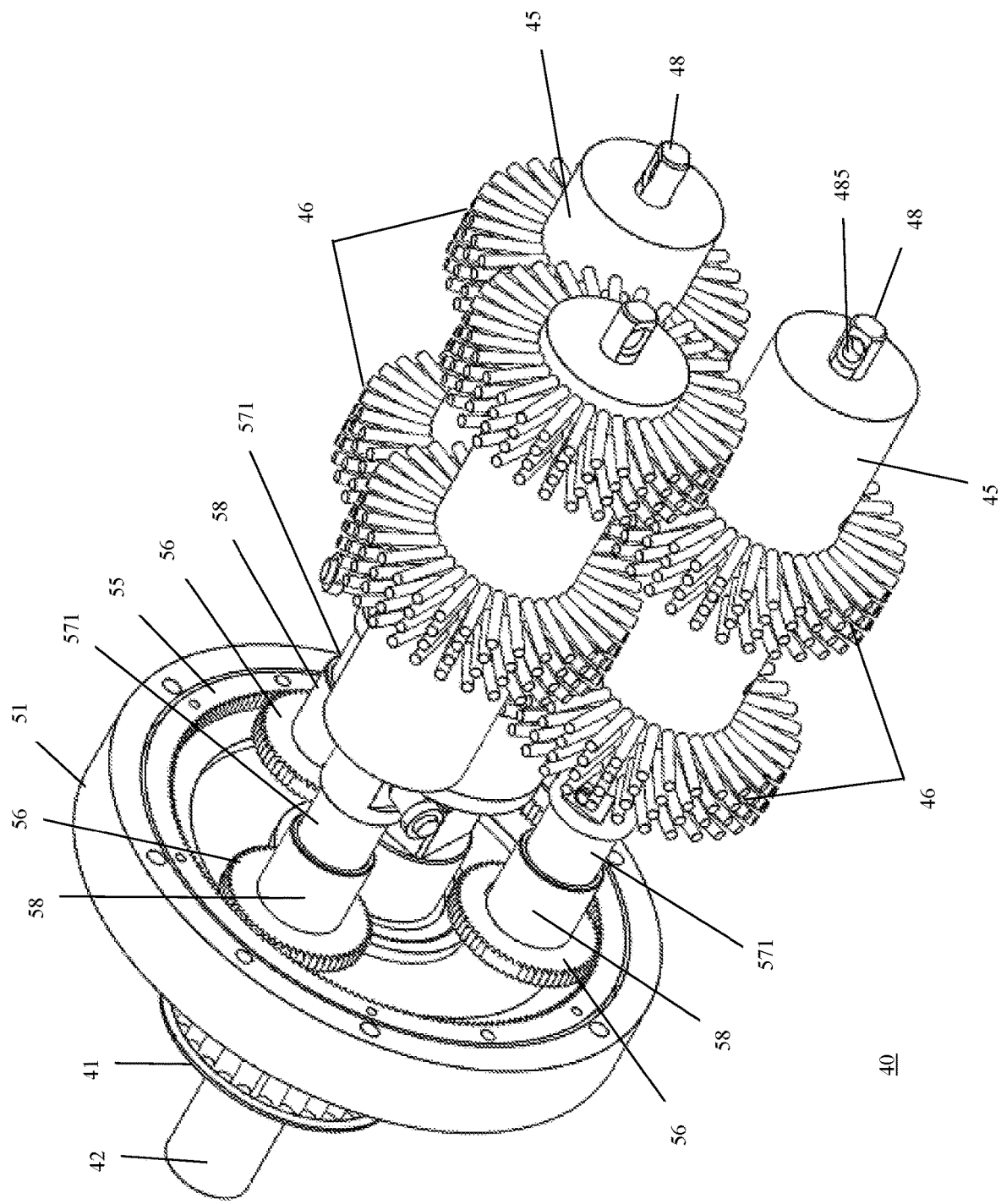
FIG. 11 comprises a perspective view of an orbital scrubbing mechanism of a wire cleaning apparatus, having supporting end plates, rotating brush housing, and driving plate removed.

FIG. 11 illustrates the active rotating brush mechanism 40, with drive end housing 525, drive end rotating brush plate 545, and the components of the support end removed such that the planetary gear mechanism is shown. The planetary gear mechanism rotates each brush assembly 45 and causes each brush assembly 45 to orbit the wire 5. As illustrated in FIG. 11, the drive end brush support shaft 571 is encircled by bearings 58. Thus, when the drive end rotating brush plate 545 rotates, it bears against surface of the bearings 58. A planetary gear 56 is disposed at the drive end of each brush support shaft 571. The planetary gears 56 engage with an annular gear 55, which is fixed in the static planetary gear housing 51. As discussed above, the planetary gear housing 51 is fixed and does not rotate. The shaft 42 connects to the rotating brush drive plate 545 such that rotation of the shaft causes the drive plate 545 to rotate. Because the brush support shafts 571 are captured in the drive plate 545, the rotation of the drive plate 545 causes the brush support shafts 571 to orbit the wire 5. Thus, when the drive plate 545 rotates, the orbital motion of the brush support shafts 571 cause the planetary gears 56 to rotate along the annular gear 55, thereby rotating the brush support shafts 571.

Figure 12:
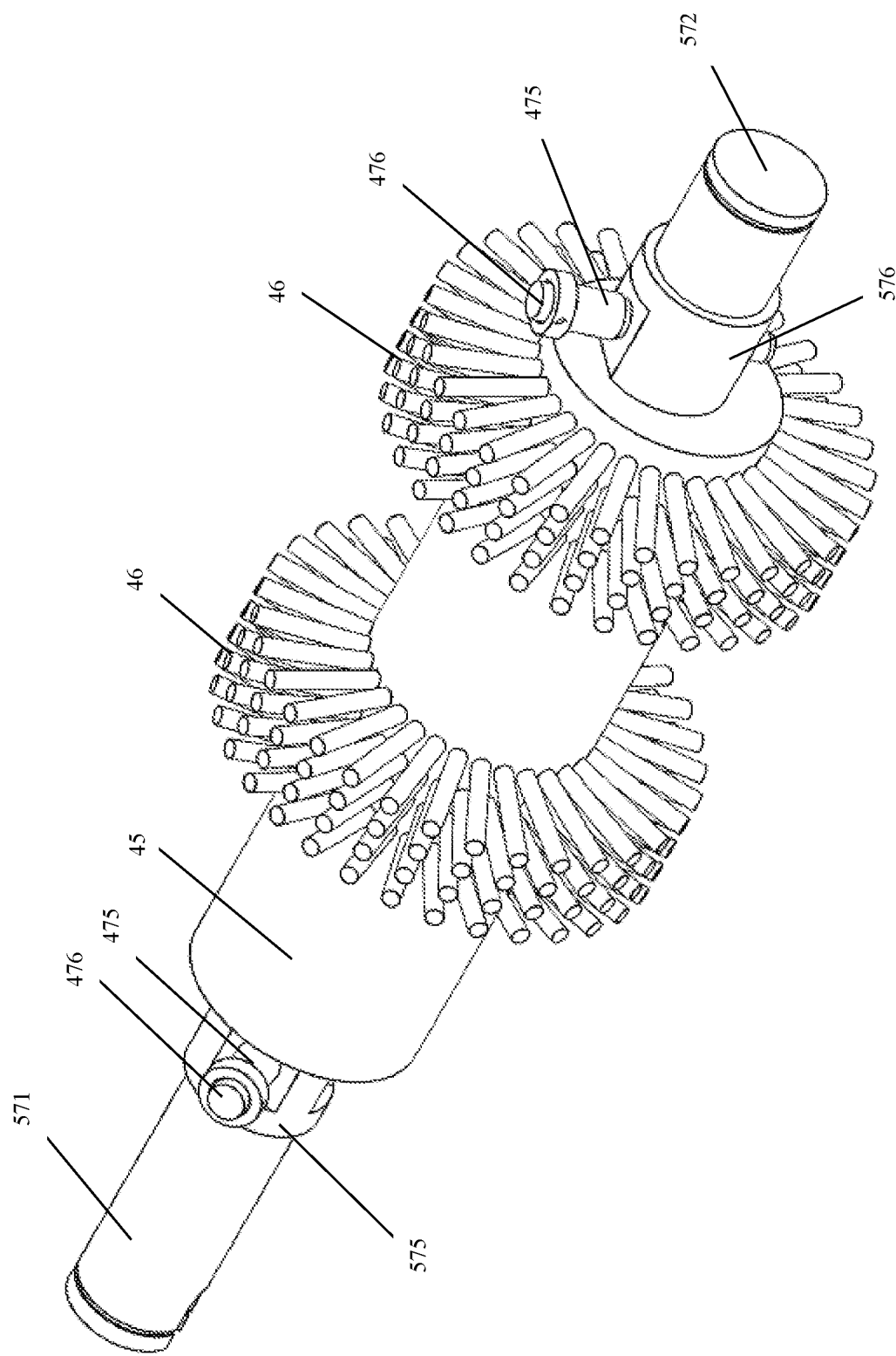
FIG. 12 comprises a perspective view of a cylindrical brush assembly with brush support shafts and quick release mechanisms.
Figure 13:
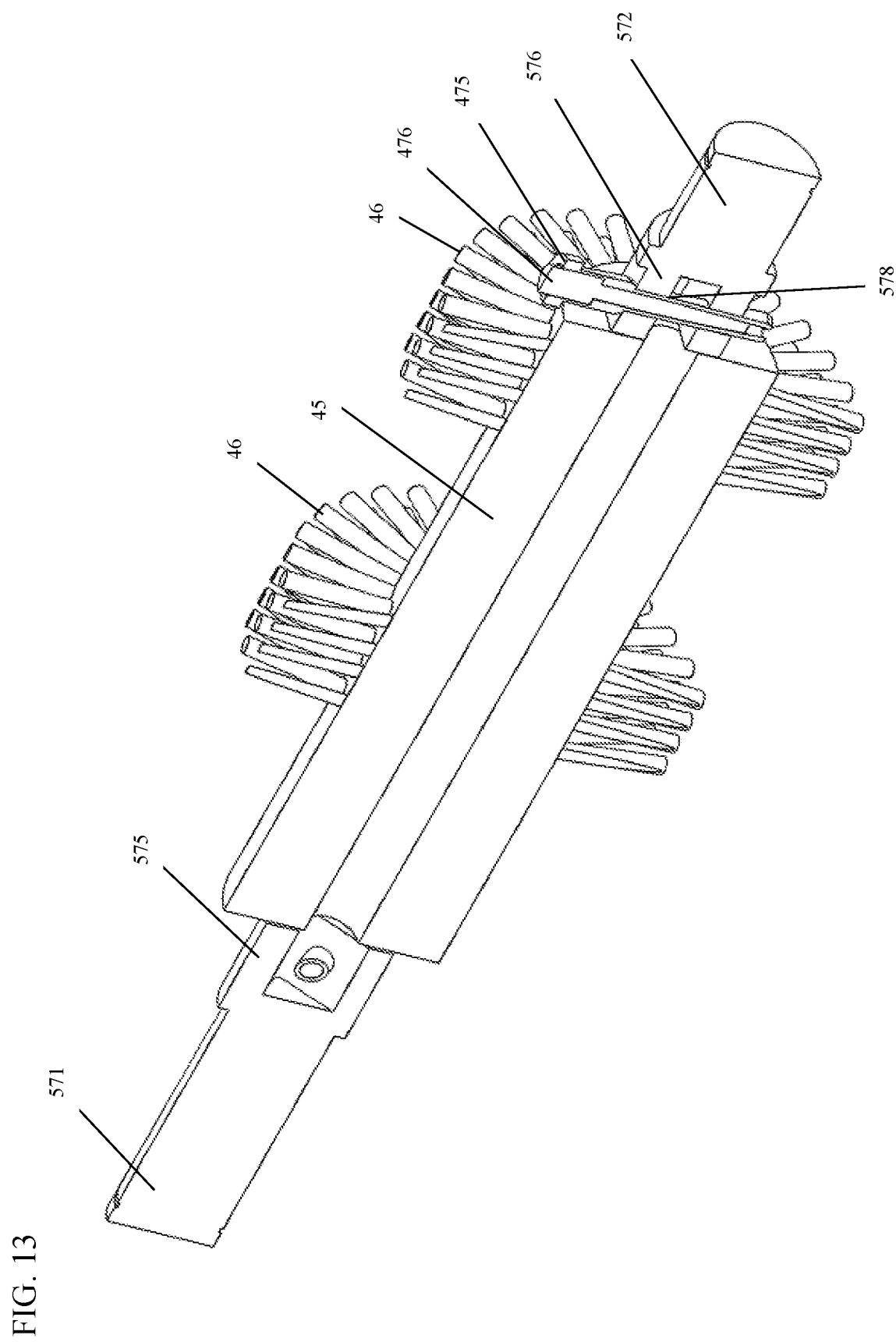
FIG. 13 comprises a cut-away perspective view of a cylindrical brush assembly, with brush support shafts and quick release mechanisms.

FIGS. 12 and 13 illustrate a single cylindrical brush assembly 45 and the support shafts 571 and 572 at either end of the cylindrical brush assembly 45. The drive end support shaft 571 includes a yoke shaped brush shaft receiver 575, and the support end support shaft 572 includes a yoke shaped shaft receiver 576. Thus, the keyed shaft 48 at either end of each cylindrical brush assembly 45 interlocks with the brush support shafts 571 and 572 at the shaft receivers 575 and 576. A quick release pin 47, comprising a body 475 and a release button 476 secures the brush shaft 48 in brush shaft receivers 575 and 576. The quick release pin 47 passes through a hole 485 in the brush shaft 48 such that the brush shaft 48 is secured. By pressing the release button 476, the quick release pin 47 is released such that it may be removed from the hole passing through the respect shaft receiver (575 or 576) and the brush shaft 48. For example, the quick release 47 may use a ball détente mechanism as is known in the art. The hole 485 may be slotted to facilitate removal of the brush shaft from the brush shaft receivers 575 and 576.

By using the quick release pin 47, the brush assemblies 45 are easily replaced, for example with longer or shorter bristles 46 that accommodate a wire 5 that is smaller or larger in diameter. The brush support shafts 571 are captive within bearings 544 in the drive plate 526. The spur gears 56 are secured within the planetary gear housing 51, preventing the shafts 571 from sliding out of the drive plate 526. Supporting members 549 rigidly connect the drive end plate 526 to the support end plate 546. The support shafts 572 are captive within bearings 544 in the support end plate 546. By incorporating a shoulder on the support shafts 572, they are prevented from sliding out of the support end plate 546. Because the shafts 571 and 572 are captive at either end of the active brush mechanism 40, and held in rigid relation to each other by the supporting members, the brush assemblies 45 can be removed and replaced easily to accommodate a wire having a smaller or larger diameter.

Figure 14:
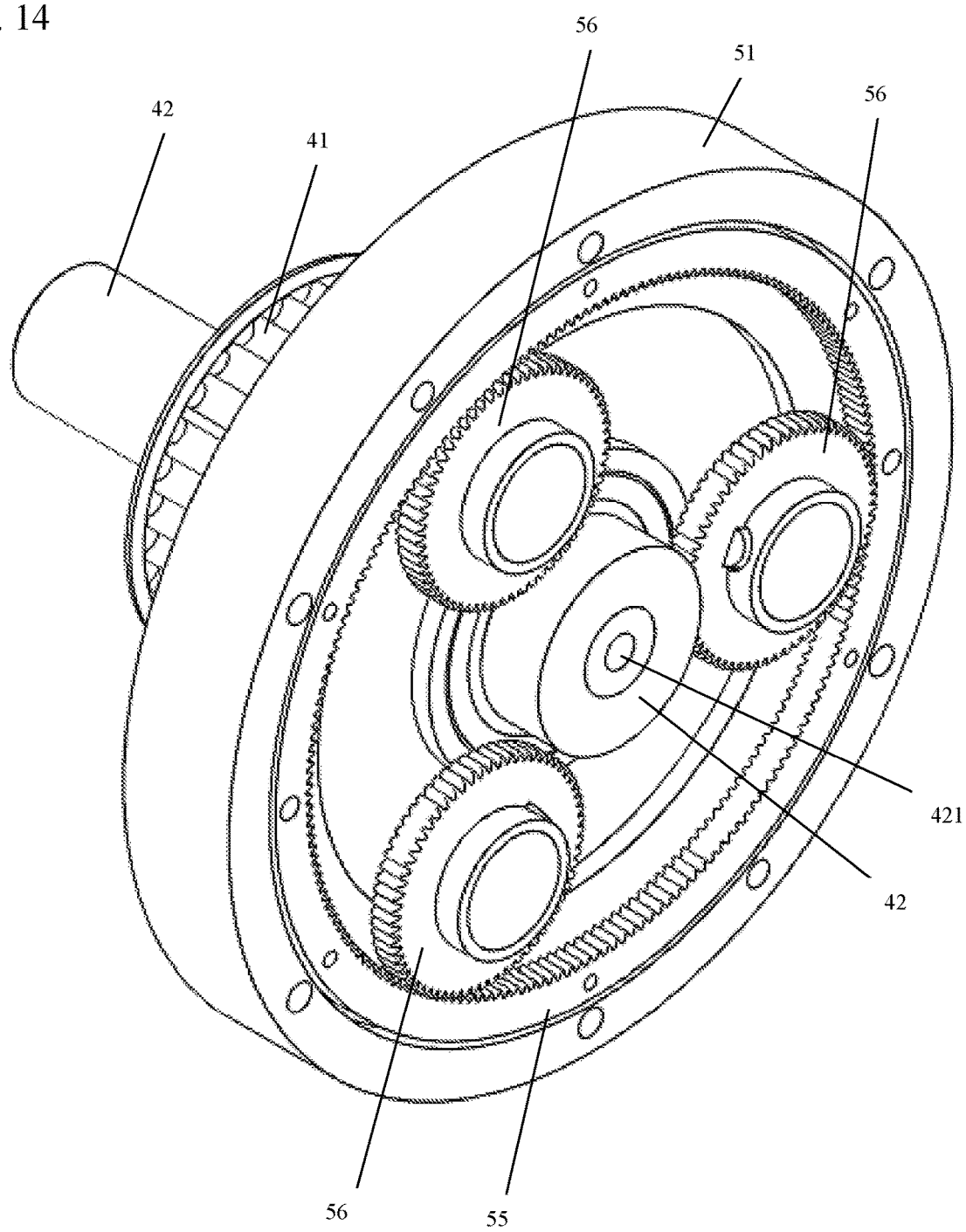
FIG. 14 comprises a cut-away perspective view along line 14-14 illustrated in FIG. 10, illustrating a planetary gear mechanism of an orbital scrubbing mechanism of a wire cleaning apparatus, with supporting end plates removed.
Figure 15:
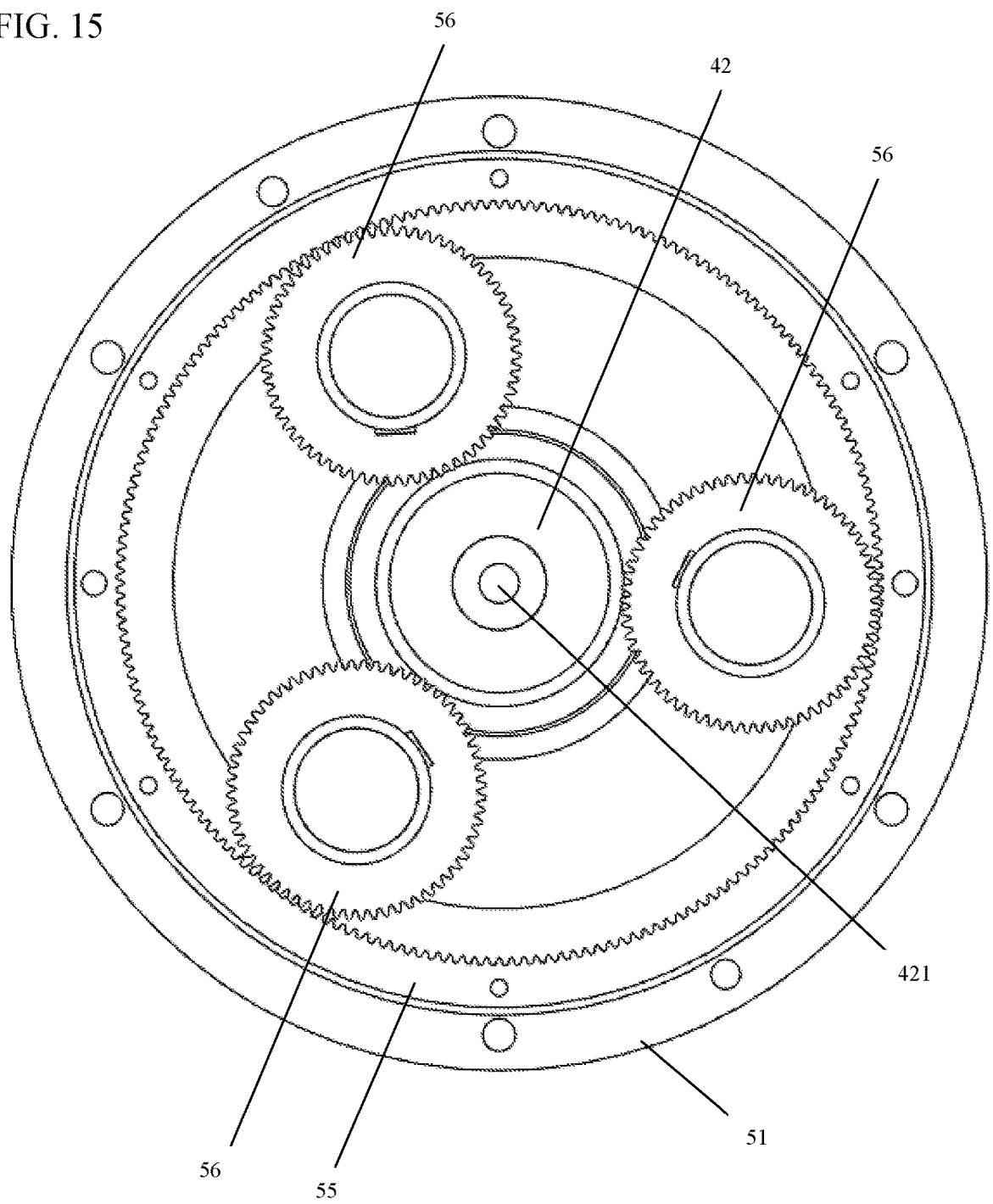
FIG. 15 comprises a cut-away end view along line 14-14 illustrated in FIG. 10, illustrating a planetary gear mechanism of an orbital scrubbing mechanism of a wire cleaning apparatus, with supporting end plates removed.

FIGS. 14 and 15 illustrate a cross-sectional view of the active rotating brush mechanism 40 along line 14-14 illustrated in FIG. 10, illustrating the planetary gear mechanism of an orbital scrubbing mechanism of the wire cleaning apparatus 10, with supporting end plates 525 and 526, and the brush assemblies 45 removed. As illustrate in FIGS. 14 and 15, the stationary planetary gear housing 51 includes the annular gear 55. Spur gears 56 disposed at the ends of each brush support shaft 571 interface with the annular gear 55 and orbit around the drive shaft 42. The wire 5 (not shown in FIGS. 14 and 15) passes through a hole 421 in the drive shaft 42. Thus, the planetary gears 56 simultaneously orbit the wire 5 and rotate, increasing the amount of cleansing action exerted by the bristles 46 on the surface of the wire 5.

In alternative embodiments the rotating brush mechanism 40 may use any other mechanism known to a person having ordinary skill in the art to rotate the cylindrical brushes 45 simultaneous to their orbital motion around the wire. For example, a system of belts and pulleys could accomplish a similar result.

Figure 16:
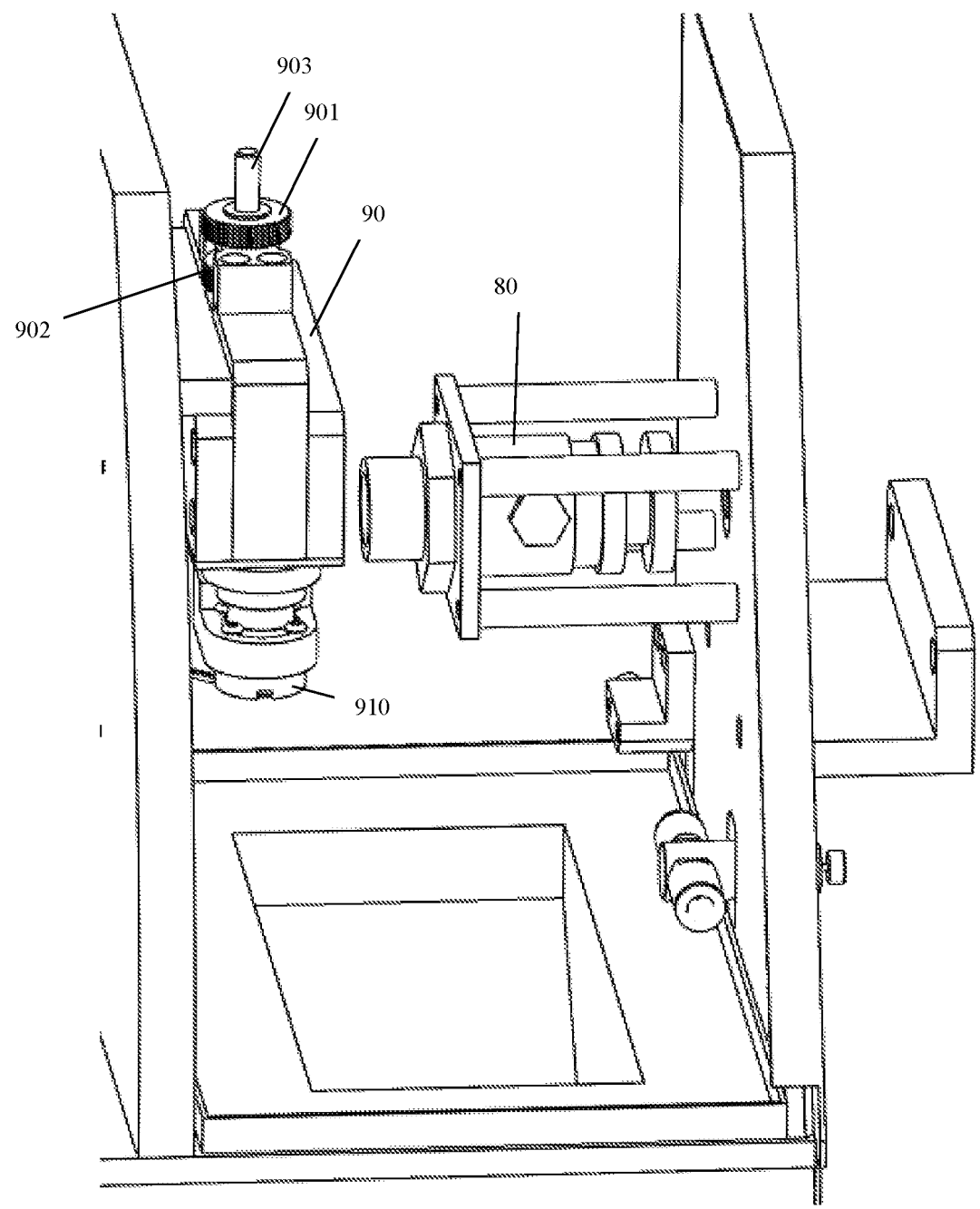
FIG. 16 comprises a perspective view of a drying stage of a wire cleaning apparatus.
Figure 17:
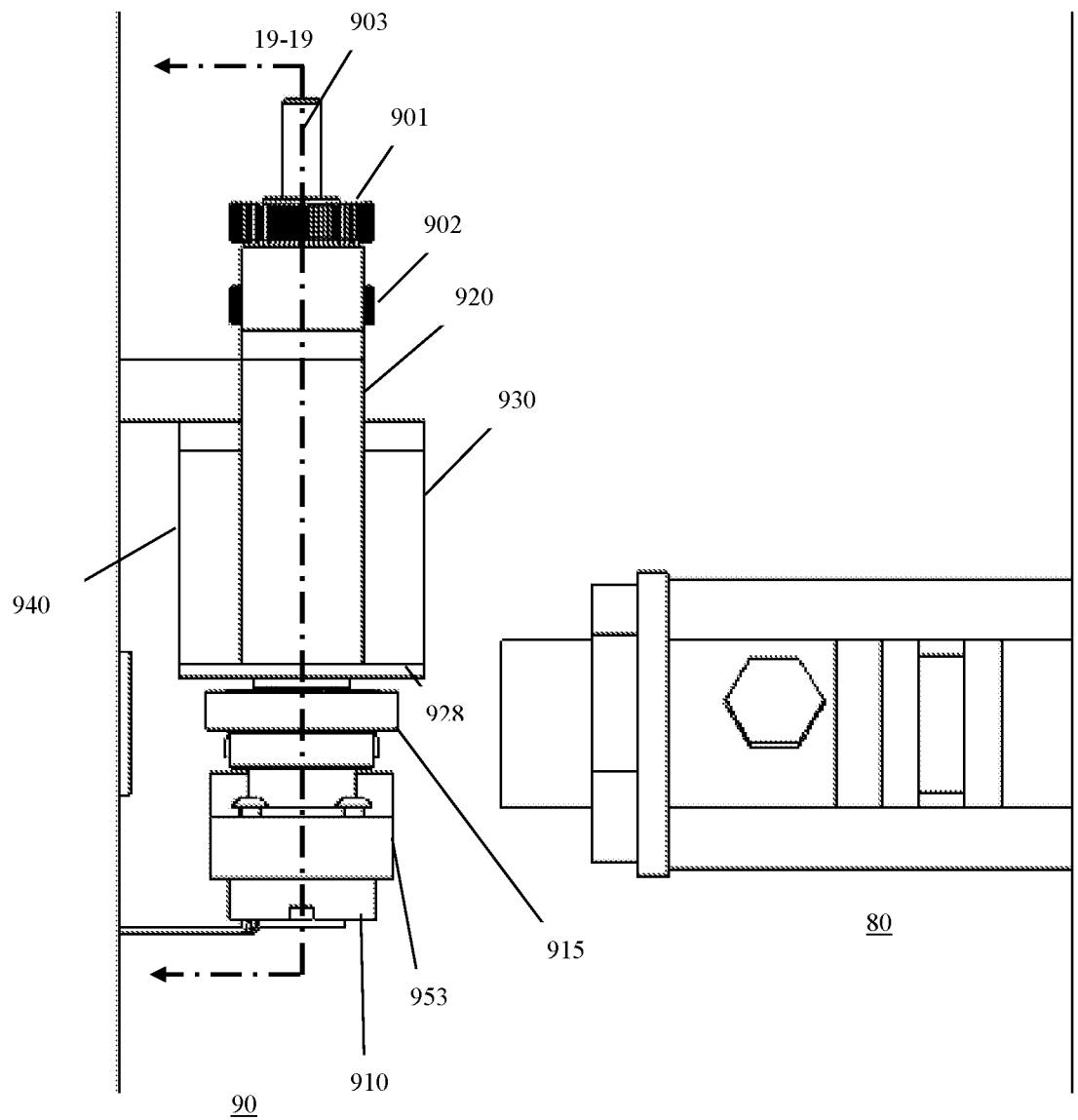
FIG. 17 comprises a front view of a drying stage of a wire cleaning apparatus.

FIGS. 16 and 17 illustrate a drying stage, which may include a wire guide mechanism 90 and a wire drying apparatus 80. The wire guide mechanism 90 includes a sensor 910 that detects movement of the wire through the wire cleaning apparatus 10, and is adjustable to accommodate a variety of wire diameters. The drying apparatus 80 uses compressed air to blow moisture off the surface of the wire 5. A valve (not shown) controls flow of the compressed air, turning off the flow of air when the wire stops moving.

The wire wipe 80 comprises a funnel disposed around the wire path. The funnel has a large end, a small end and an input. The input is configured to deliver high-speed air to the funnel. The funnel and the input act as a pneumatic drying mechanism which remove fluid from the wire 5.

A threaded rod 903 adjusts the wire guide mechanism 90. An adjustment knob 901 and a locking adjustment knob 902 serve to adjust and lock the wire guide mechanism 90. The wire guide mechanism includes a body 920 that surrounds and encompasses the adjustment mechanism. A front body plate 930 and a back body plate 940 enclose the front and back of the adjustment mechanism, and a body bottom plate supports the sensor 910 on an encoder support member 953. An idler roller 915 is mounted on the shaft of the encoder 910.

Figure 18:
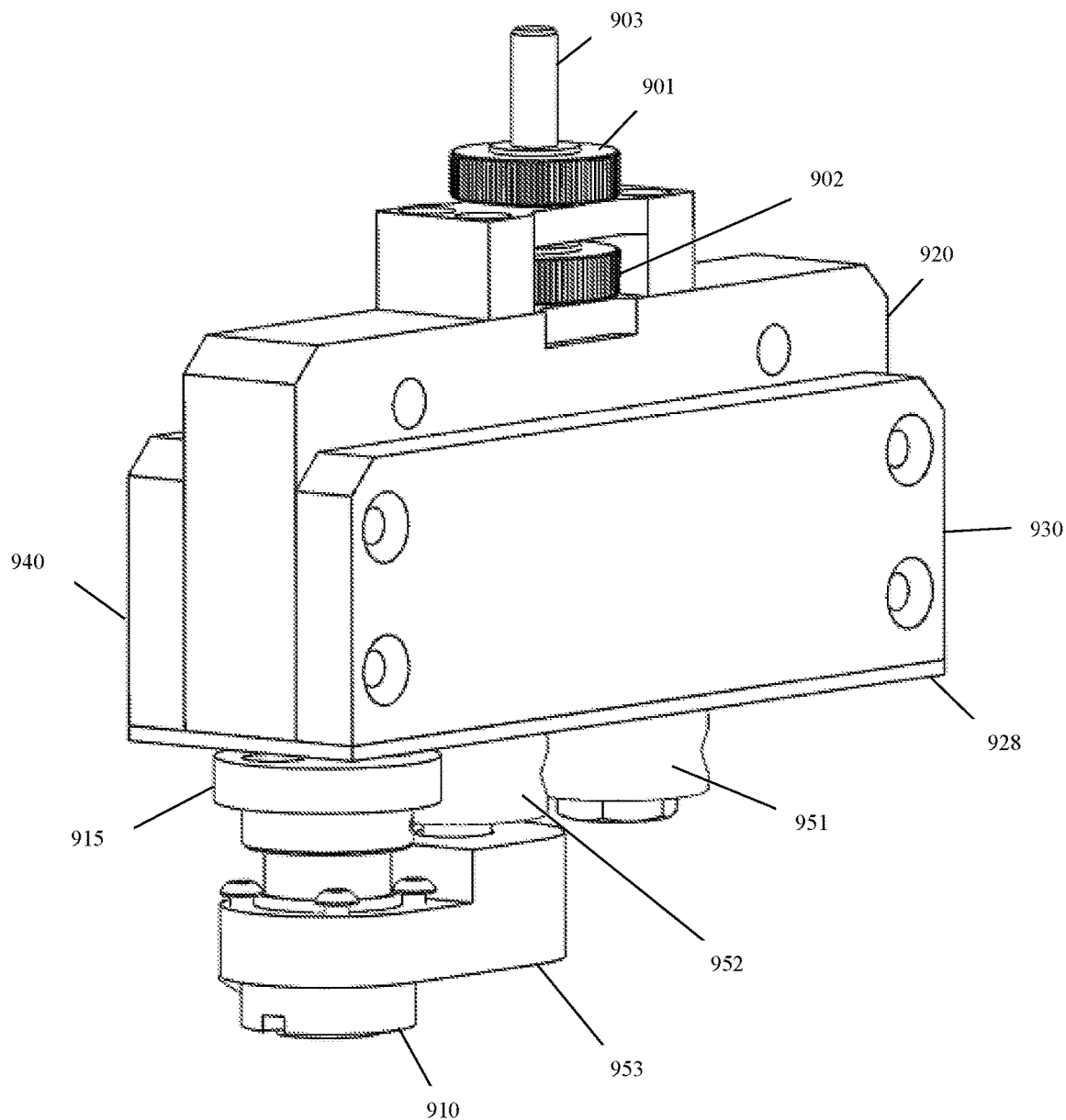
FIG. 18 comprises a perspective view of a wire guide and movement detection mechanism of a wire cleaning apparatus.

FIG. 18 provides an isometric view of the wire guide mechanism 90, isolated from the wire cleaning apparatus 10. In addition to the features already described, FIG. 18 illustrates wire guide rollers 951 and 952. The idler roller 915 comprises a compliant and resilient material such as hard rubber, and rolls along the surface of the wire guide roller 952.

Figure 19:
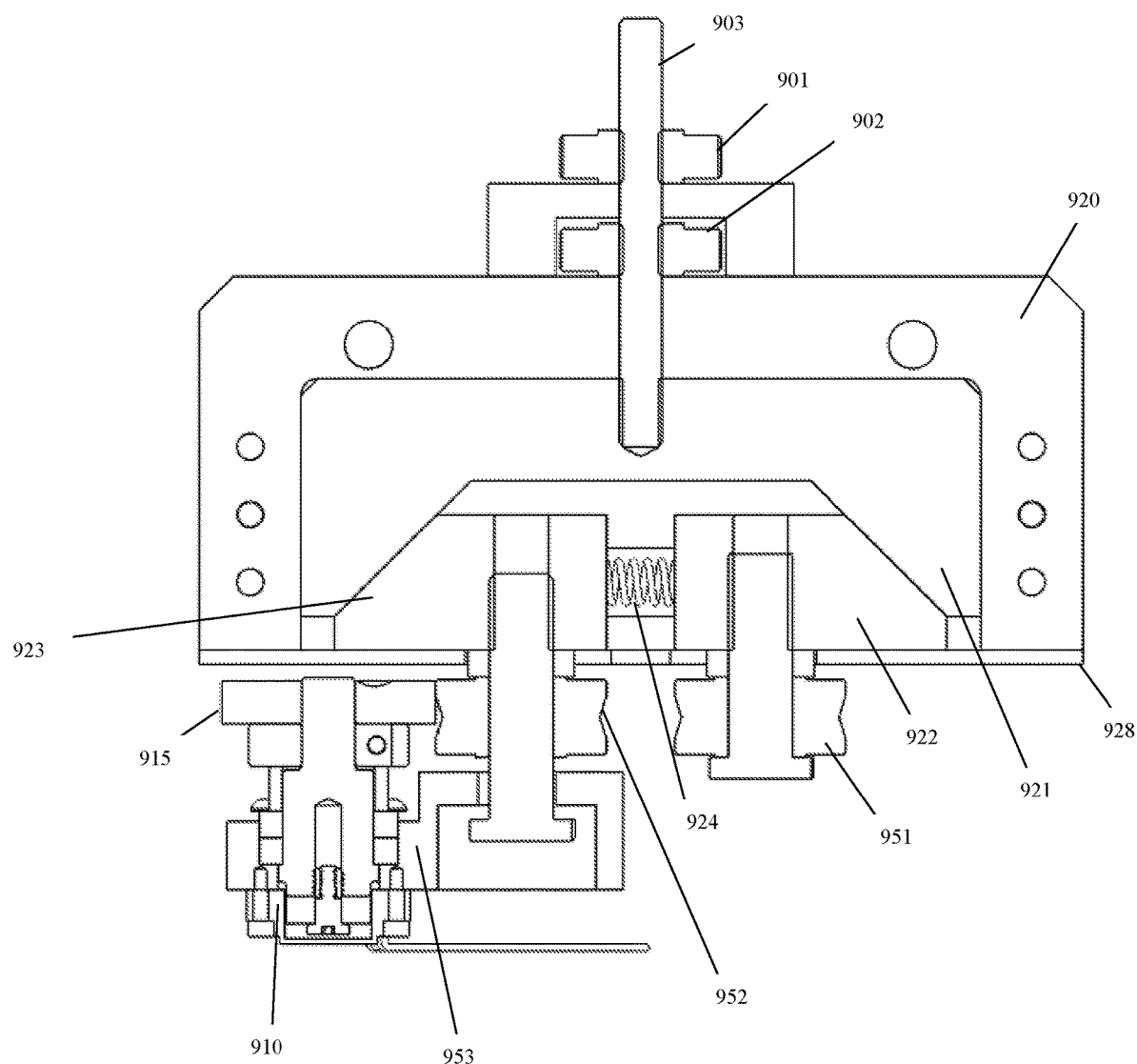
FIG. 19 comprises a cut-away view of a wire guide and movement detection mechanism along line 19-19 illustrated in FIG. 17, illustrating the movement detection mechanism of a wire cleaning apparatus in an open position.
Figure 20:
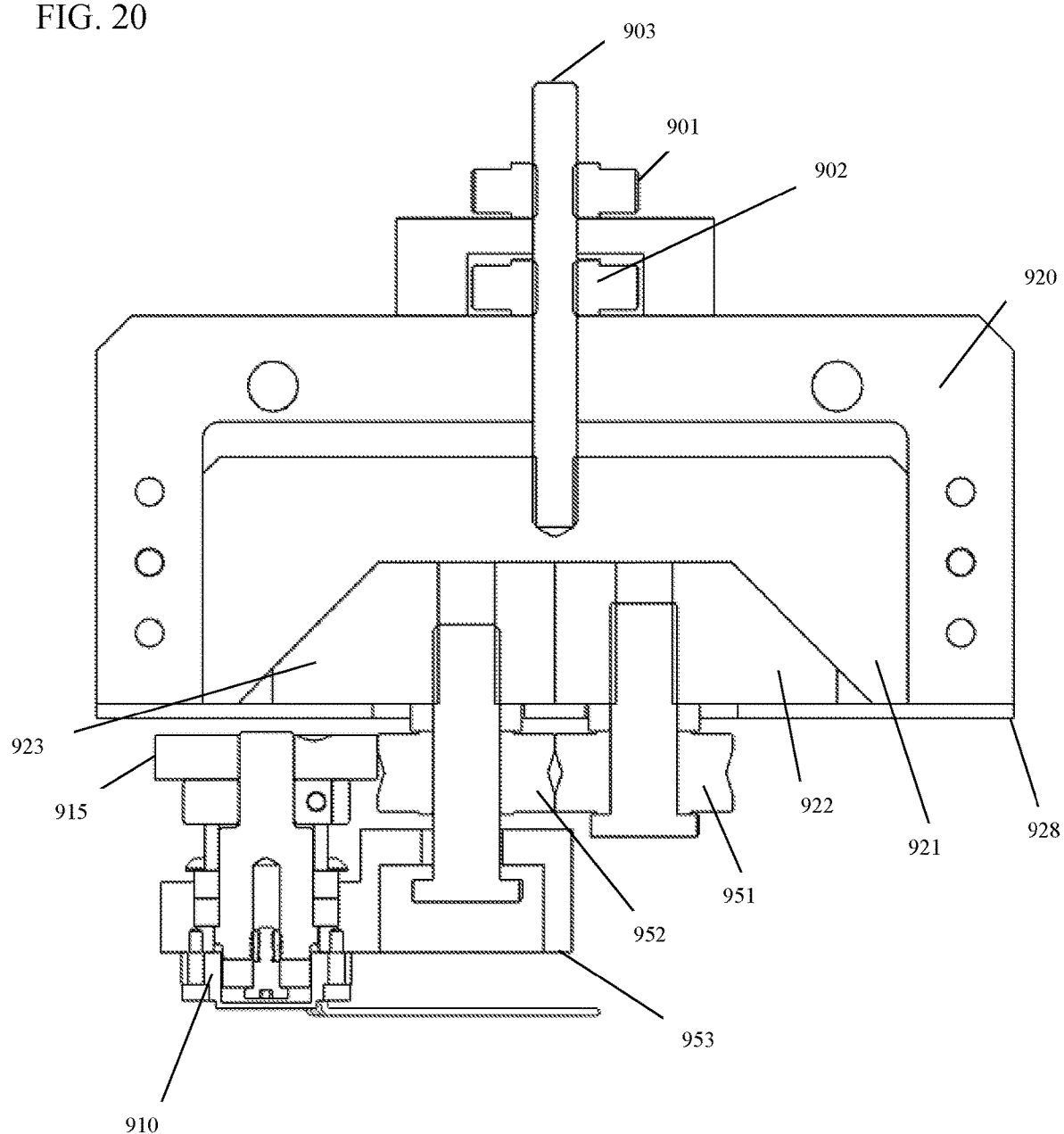
FIG. 20 comprises a cut-away view of a wire guide and movement detection mechanism along line 19-19 illustrated in FIG. 17, illustrating the movement detection mechanism of a wire cleaning apparatus in a closed position.

FIGS. 19-20 show a cross-sectional view along line 19-19 illustrated in FIG. 17, illustrating the adjustment mechanism of the wire guide mechanism 90. As discussed above, the wire guide mechanism 90 includes guide rollers 951 and 952, which are adjustable to accommodate a variety of wire diameters. The threaded rod 903 drives an adjustment cam 921 down into the body 920 of the wire guide mechanism. The guide rollers 951 and 952 are mounted on cam followers 922 and 923 such that when the adjustment cam 921 drives downwards, the guide rollers 951 and 952 are driven together. A spring 924 provides a force to drive the cam followers 922 and 923 apart when the threaded rod 903 retracts.

FIG. 19 illustrates the adjustment mechanism in an open position in which the wire guide rollers 951 and 952 are drawn away from each other. To achieve the open position of the wire guide rollers 951 and 952 the adjustment cam is raised as far as possible by the threaded rod 903. The adjustment knob 901 and the locking knob 902 are rotated counter-clockwise (as viewed from above) to draw the threaded rod 903 upwards. The spring 924 drives the cam followers 922 and 923 apart.

FIG. 20 illustrates the adjustment mechanism in a closed position in which the wire guide rollers 951 and 952 are squeezed towards each other. To achieve the closed position of the wire guide rollers 951 and 952 the adjustment cam is lowered as far as possible by the threaded rod 903. The adjustment knob 901 and the locking knob 903 are rotated clockwise (as viewed from above) to push the threaded rod 903 downwards. The adjustment cam 921 drives the cam followers 922 and 923 together. By adjusting the position of the wire guide rollers 951 and 952, the wire guide mechanism 90 can be sized easily to accommodate a wire having a smaller or larger diameter.

The encoder 910 is mounted on the encoder support member 953, which is mounted on a shaft running through the guide roller 952. Thus, the encoder moves with the guide roller 952. The encoder 910 provides a varying, repeating signal (e.g., quadrature pulses) in response to movement of the wire 5. When the wire 5 is stationary, the encoder 910 does not provide the signal. The wire cleaning apparatus uses the encoder signal to identify movement of the wire 5 and to stop and start portions of the wire cleaning apparatus including the rotating brush mechanism 40 and the wire wipe 80. For example, based on the signal output from the encoder, the rotating brush mechanism 40 or the pneumatic drying mechanism may be switched from an active to an inactive state. This conserves energy and prevents undue wear on the surface of the wire. By stopping the motion of the rotating brush mechanism 40 and turning off the flow of compressed air in the wire air wipe 80 electricity and compressed air are conserved. Further, by stopping the motion of the rotating brush mechanism 40 the active cleaning of the wire surface stops, which prevents the bristles 46 from scraping or polishing the surface of the wire 5.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

What is claimed is:

1. A wire cleaning apparatus comprising:
  a passive brush mechanism surrounding and defining a wire path, comprising:
    a helical brush having a plurality of first bristles affixed to a helical structure, the helical structure having a helical axis substantially coincident with the wire path, the plurality of first bristles generally oriented inwardly from the helical structure toward the wire path;
    a first member slidably affixed to the passive brush mechanism and coupled to a first end of the helical brush;
    a fixed surface of the passive brush mechanism coupled to a second end of the helical brush; and
  an active brush mechanism disposed around the wire path and configured to rotate about the wire path, the active brush mechanism comprising at least one cylindrical brush having a plurality of second bristles disposed on a cylindrical surface such that one or more of the plurality of second bristles impinge upon the wire path, the at least one cylindrical brush having a cylindrical axis about which the at least one cylindrical brush is configured to rotate relative to the active brush mechanism.

2. The wire cleaning apparatus of claim 1, further comprising:
  at least one adjustably mounted nozzle disposed in the vicinity of the active brush mechanism and in fluid communication with a reservoir configured to receive a detergent solution.

3. The wire cleaning apparatus of claim 1, the passive brush mechanism further comprising:
  a plurality of slots arranged in the passive brush mechanism substantially parallel to the wire path; and
  at least one tension adjuster engaged through one of the plurality of slots with the first member, such that the tension adjuster secures the first member in a position relative to the plurality of slots.

4. The wire cleaning apparatus of claim 1, the active brush mechanism further comprising an annular gear, and the at least one cylindrical brush further comprising a spur gear disposed to interact with the annular gear on the active brush mechanism such that the spur gear is configured to cause the cylindrical brush to rotate on the cylindrical axis when the active mechanism rotates about the wire path.

5. The wire cleaning apparatus of claim 1, the active brush mechanism further comprising a stationary pulley and a belt disposed on the stationary pulley, and the at least one cylindrical brush further comprising a pulley about which the belt wraps such that the belt is configured to cause the cylindrical brush to rotate on the cylindrical axis when the active mechanism rotates about the wire path.

6. The wire cleaning apparatus of claim 1, further comprising:
  a drying stage comprising a funnel disposed around the wire path, the funnel having a large end and a small end and an input configured to deliver high-speed air to the funnel.

7. The wire cleaning apparatus of claim 6, further comprising:
  a motion detection sensor configured to change a signal in response to motion of a wire traveling along the wire path; and
  a control device configured to activate the drying stage in response to the change in the signal from the motion detection sensor.

8. The wire cleaning apparatus of claim 1, further comprising:
  a motion detection sensor configured to change a signal in response to motion of a wire traveling along the wire path; and a control device configured to activate the active brush mechanism in response to the change in the signal from the motion detection sensor.

9. The wire cleaning apparatus of claim 1, a resilient wiper having an aperture concentric with the wire path, the aperture configured to receive a wire of a predetermined cross-sectional profile.

10. The wire cleaning apparatus of claim 9, further comprising a wiper holder configured to receive the resilient wiper, the wiper holder disposed at a fixed location along the wire path.

11. A wire cleaning apparatus comprising:
a passive brush mechanism surrounding and defining a wire path, comprising:
  a helical brush having a plurality of first bristles affixed to a helical structure, the helical structure having a helical axis substantially coincident with the wire path, the plurality of first bristles generally oriented inwardly from the helical structure toward the wire path;
  a first member slidably affixed to the passive brush mechanism and coupled to a first end of the helical brush;
an active brush mechanism disposed around the wire path and configured to rotate about the wire path, the active brush mechanism comprising at least one cylindrical brush having a plurality of second bristles disposed on a cylindrical surface such that one or more of the plurality of second bristles impinge upon the wire path, the at least one cylindrical brush having a cylindrical axis about which the at least one cylindrical brush is configured to rotate relative to the active brush mechanism; and
a resilient wiper having an aperture concentric with the wire path, the aperture configured to receive a wire of a predetermined cross-sectional profile.

12. The wire cleaning apparatus of claim 11, further comprising a wiper holder configured to receive the resilient wiper, the wiper holder disposed at a fixed location along the wire path.

13. The wire cleaning apparatus of claim 11, further comprising further comprising a second member slidably affixed to the passive brush mechanism and coupled to a second end of the helical brush.

14. The wire cleaning apparatus of claim 11, further comprising:
at least one adjustably mounted nozzle disposed in the vicinity of the active brush mechanism and in fluid communication with a reservoir configured to receive a detergent solution.

15. The wire cleaning apparatus of claim 11, the passive brush mechanism further comprising:
a plurality of slots arranged in the passive brush mechanism substantially parallel to the wire path; and
at least one tension adjuster engaged through one of the plurality of slots with the first member, such that the tension adjuster secures the first member in a position relative to the plurality of slots.

16. The wire cleaning apparatus of claim 11, the active brush mechanism further comprising an annular gear, and the at least one cylindrical brush further comprising a spur gear disposed to interact with the annular gear on the active brush mechanism such that the spur gear is configured to cause the cylindrical brush to rotate on the cylindrical axis when the active mechanism rotates about the wire path.

17. The wire cleaning apparatus of claim 11, the active brush mechanism further comprising a stationary pulley and a belt disposed on the stationary pulley, and the at least one cylindrical brush further comprising a pulley about which the belt wraps such that the belt is configured to cause the cylindrical brush to rotate on the cylindrical axis when the active mechanism rotates about the wire path.

18. A wire cleaning apparatus comprising:
a passive brush mechanism surrounding and defining a wire path, comprising:
  a helical brush having a plurality of first bristles affixed to a helical structure, the helical structure having a helical axis substantially coincident with the wire path, the plurality of first bristles generally oriented inwardly from the helical structure toward the wire path;
  a first member slidably affixed to the passive brush mechanism and coupled to a first end of the helical brush; and
an active brush mechanism disposed around the wire path and configured to rotate about the wire path, the active brush mechanism comprising:
  at least one cylindrical brush having a plurality of second bristles disposed on a cylindrical surface such that one or more of the plurality of second bristles impinge upon the wire path, the at least one cylindrical brush having a cylindrical axis about which the at least one cylindrical brush is configured to rotate relative to the active brush mechanism;
  a drive gear fixedly coupled to the wire cleaning apparatus, encircling the wire path;
  a drive plate rotatable about the wire path and adjacent the gear;
  a support plate rotatable about the wire path;
  a first shaft disposed within the drive plate, the first shaft comprising a spur gear disposed to interact with the drive gear such that the spur gear is configured to cause the first shaft to rotate on the cylindrical axis when the active mechanism rotates about the wire path; and
  a second shaft disposed within the support plate,
wherein the at least one cylindrical brush is removably coupled at a first end to the first shaft and removably coupled at a second end to the second shaft.

19. The wire cleaning apparatus of claim 18, further comprising further comprising a second member slidably affixed to the passive brush mechanism and coupled to a second end of the helical brush.

20. The wire cleaning apparatus of claim 18, the passive brush mechanism further comprising:
a plurality of slots arranged in the passive brush mechanism substantially parallel to the wire path; and
at least one tension adjuster engaged through one of the plurality of slots with the first member, such that the tension adjuster secures the first member in a position relative to the plurality of slots.

* * * * *